United States Patent
Iwamoto et al.

(10) Patent No.: US 12,512,809 B2
(45) Date of Patent: Dec. 30, 2025

(54) ACOUSTIC WAVE DEVICE

(71) Applicant: Murata Manufacturing Co., Ltd., Nagaokakyo (JP)

(72) Inventors: Hideki Iwamoto, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 799 days.

(21) Appl. No.: 17/894,220

(22) Filed: Aug. 24, 2022

(65) Prior Publication Data

US 2022/0407493 A1 Dec. 22, 2022

Related U.S. Application Data

(63) Continuation of application No. PCT/JP2021/008117, filed on Mar. 3, 2021.

(30) Foreign Application Priority Data

Mar. 3, 2020 (JP) .................. 2020-036293

(51) Int. Cl.
*H03H 9/02* (2006.01)
*H03H 9/13* (2006.01)
*H03H 9/17* (2006.01)

(52) U.S. Cl.
CPC .... *H03H 9/02086* (2013.01); *H03H 9/02015* (2013.01); *H03H 9/131* (2013.01); *H03H 9/17* (2013.01)

(58) Field of Classification Search
CPC ........... H03H 6/02086; H03H 9/02015; H03H 9/131; H03H 9/17

USPC ...... 310/313 R, 313 A, 313 B, 313 C, 313 D
See application file for complete search history.

(56) References Cited

U.S. PATENT DOCUMENTS

| | | | | |
|---|---|---|---|---|
| 5,998,907 A | * | 12/1999 | Taguchi | ............ H03H 9/02921 310/357 |
| 2013/0285768 A1 | | 10/2013 | Watanabe et al. | |
| 2018/0159497 A1 | | 6/2018 | Iwamoto et al. | |

FOREIGN PATENT DOCUMENTS

| | | |
|---|---|---|
| JP | 2002009584 A | 1/2002 |
| WO | 2012086639 A1 | 6/2012 |
| WO | 2013031651 A1 | 3/2013 |
| WO | 2017043427 A1 | 3/2017 |

OTHER PUBLICATIONS

International Search Report in PCT/JP2021/008117, mailed Apr. 13, 2021, 3 pages.
Written Opinion in PCT/JP2021/008117, mailed Apr. 13, 2021, 3 pages.

* cited by examiner

*Primary Examiner* — Derek J Rosenau
(74) *Attorney, Agent, or Firm* — Keating & Bennett, LLP

(57) ABSTRACT

An acoustic wave device includes a support substrate, a multilayer body, and an IDT electrode. The multilayer body includes a lithium tantalate piezoelectric layer and a lithium niobate piezoelectric layer that are laminated, and is on the support substrate. The IDT electrode is on the multilayer body, and includes electrode fingers. When a wavelength of an acoustic wave determined by a pitch of the electrode fingers is denoted as $\lambda$, a thickness of the multilayer body is about $0.66\lambda$ or less.

20 Claims, 13 Drawing Sheets

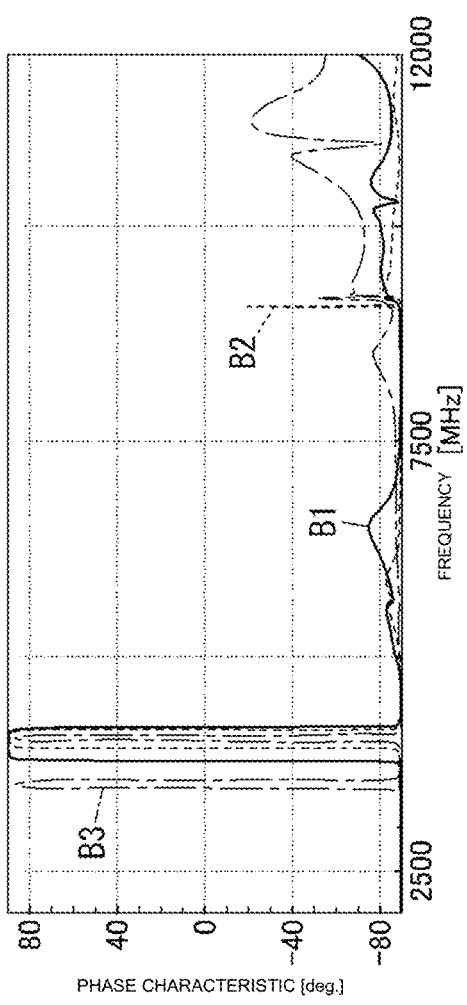
FIG. 8A
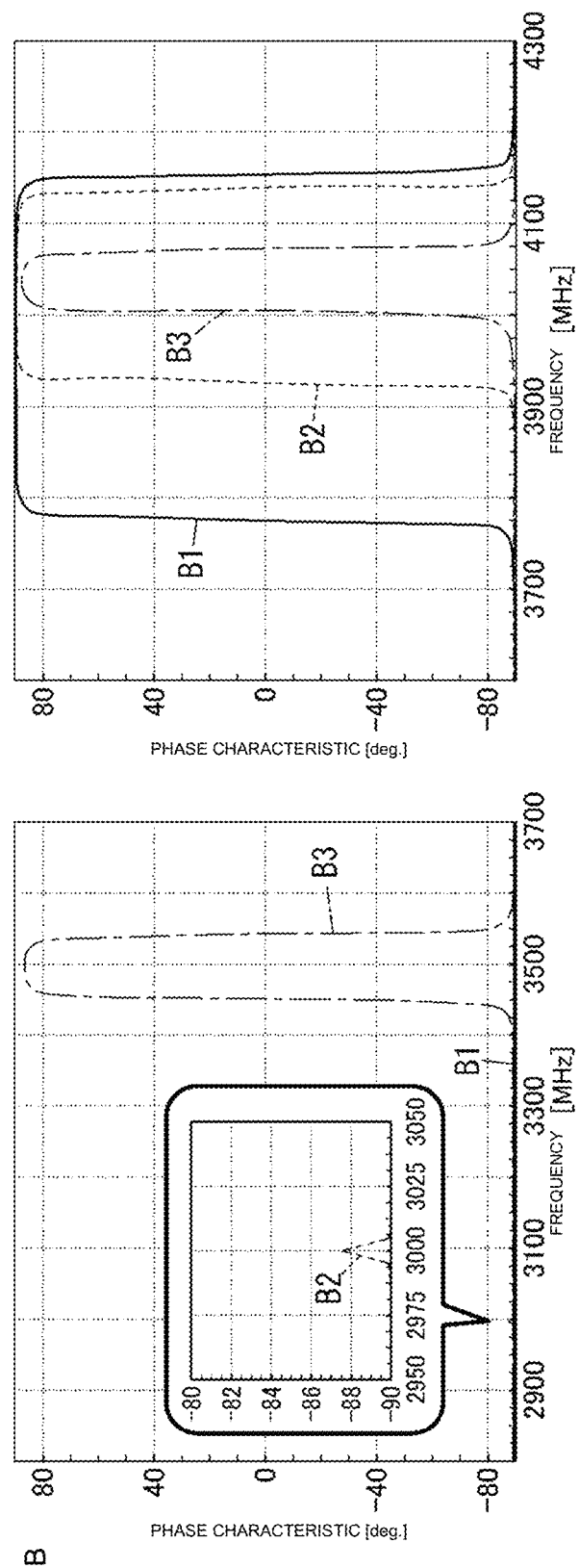
FIG. 8B
FIG. 8C

ACOUSTIC WAVE DEVICE

CROSS REFERENCE TO RELATED APPLICATIONS

This application claims the benefit of priority to Japanese Patent Application No. 2020-036293 filed on Mar. 3, 2020 and is a Continuation Application of PCT Application No. PCT/JP2021/008117 filed on Mar. 3, 2021. The entire contents of each application are hereby incorporated herein by reference.

BACKGROUND OF THE INVENTION

1. Field of the Invention

The present invention relates to an acoustic wave device, and more particularly, to an acoustic wave device including an IDT (Interdigital Transducer) electrode.

2. Description of the Related Art

International Publication No. 2012/086639 describes an acoustic wave device according to the related art. The acoustic wave device described in International Publication No. 2012/086639 includes a high acoustic velocity support substrate (support substrate), a piezoelectric film (piezoelectric layer), and an IDT electrode. In the acoustic wave device described in International Publication No. 2012/086639, the IDT electrode is formed on one surface of the piezoelectric film.

The acoustic wave device according to the related art described in International Publication No. 2012/086639 has a problem in that a Rayleigh mode spurious response may be generated in a band of a lower frequency side relative to an excitation mode used to achieve characteristics, and a higher-order mode spurious response may be generated in a band of a higher frequency side relative to the excitation mode. With such a problem, the characteristics of the device may be deteriorated.

SUMMARY OF THE INVENTION

Preferred embodiments of the present invention provide acoustic wave devices that are each able to reduce or prevent a Rayleigh mode spurious response generated in a band of a lower frequency side relative to an excitation mode used to achieve characteristics, and a higher-order mode spurious response generated in a band of a higher frequency side relative to the excitation mode.

An acoustic wave device according to a preferred embodiment of the present invention includes a support substrate, a multilayer body, and an IDT electrode. The multilayer body includes a lithium tantalate piezoelectric layer and a lithium niobate piezoelectric layer that are laminated, and is provided on the support substrate. The IDT electrode is provided on the multilayer body and includes a plurality of electrode fingers. When a wavelength of an acoustic wave determined by a pitch of the plurality of electrode fingers is denoted as $\lambda$, a thickness of the multilayer body is about $0.66\lambda$ or less.

With acoustic wave devices according to preferred embodiments of the present invention, it is possible to reduce a Rayleigh mode spurious response generated in a band of a lower frequency side relative to an excitation mode used to achieve characteristics, and a higher-order mode spurious response generated in a band of a higher frequency side relative to the excitation mode.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8A is a graph illustrating a phase characteristic of the acoustic wave device according to Preferred Embodiment 4 of the present invention. FIG. 8B is a graph illustrating a phase characteristic of the same acoustic wave device in a Rayleigh mode. FIG. 8C is a graph illustrating a phase characteristic of the same acoustic wave device in a main mode.

DETAILED DESCRIPTION OF THE PREFERRED EMBODIMENTS

Figure 1:
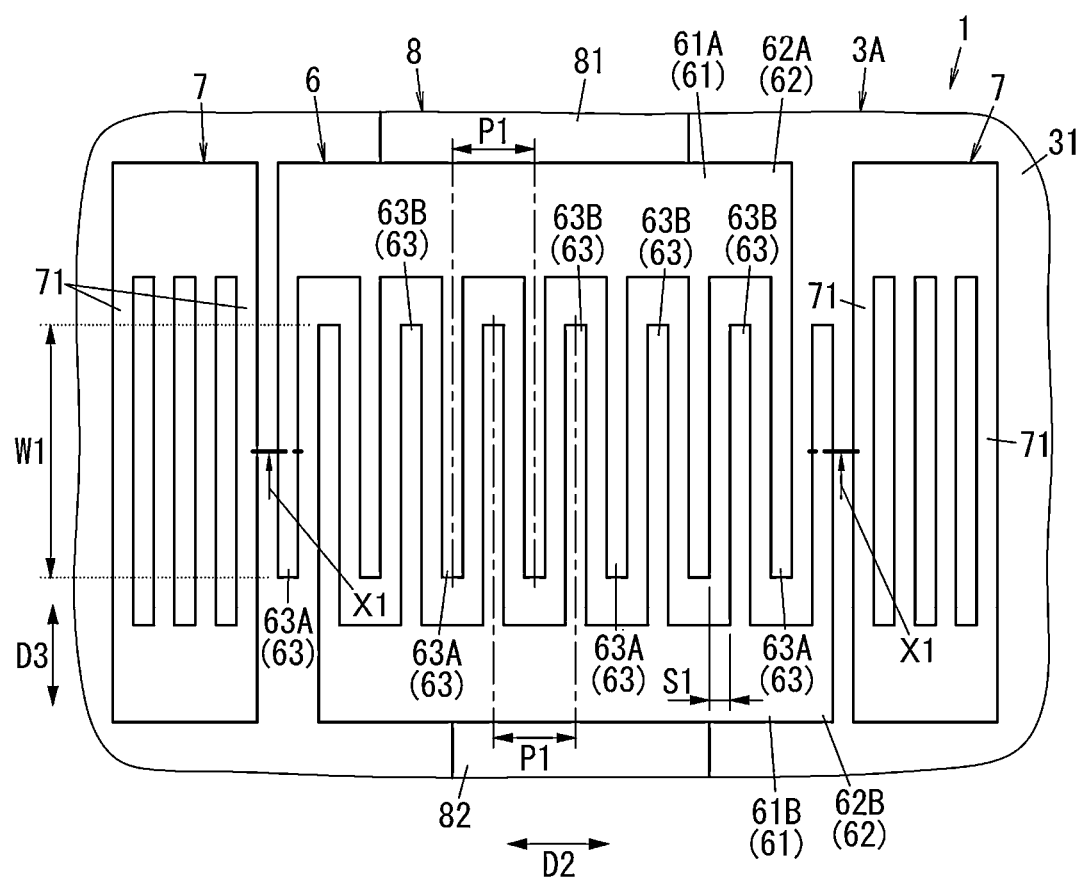
FIG. 1 is a front view of an acoustic wave device according to Preferred Embodiment 1 of the present invention.

Hereinafter, acoustic wave devices according to preferred embodiments of the present invention will be described with reference to the drawings. FIG. 1, FIG. 2, FIG. 7, FIG. 11, FIG. 12, and FIG. 13 to be referred to in the following preferred embodiments and the like are schematic views, and ratios of sizes and thicknesses of elements in the drawings do not necessarily reflect actual dimensional ratios.

Preferred Embodiment 1

(1) Acoustic Wave Device

An overall configuration of an acoustic wave device 1 according to Preferred Embodiment 1 of the present invention will be described with reference to the drawings.

Figure 2:
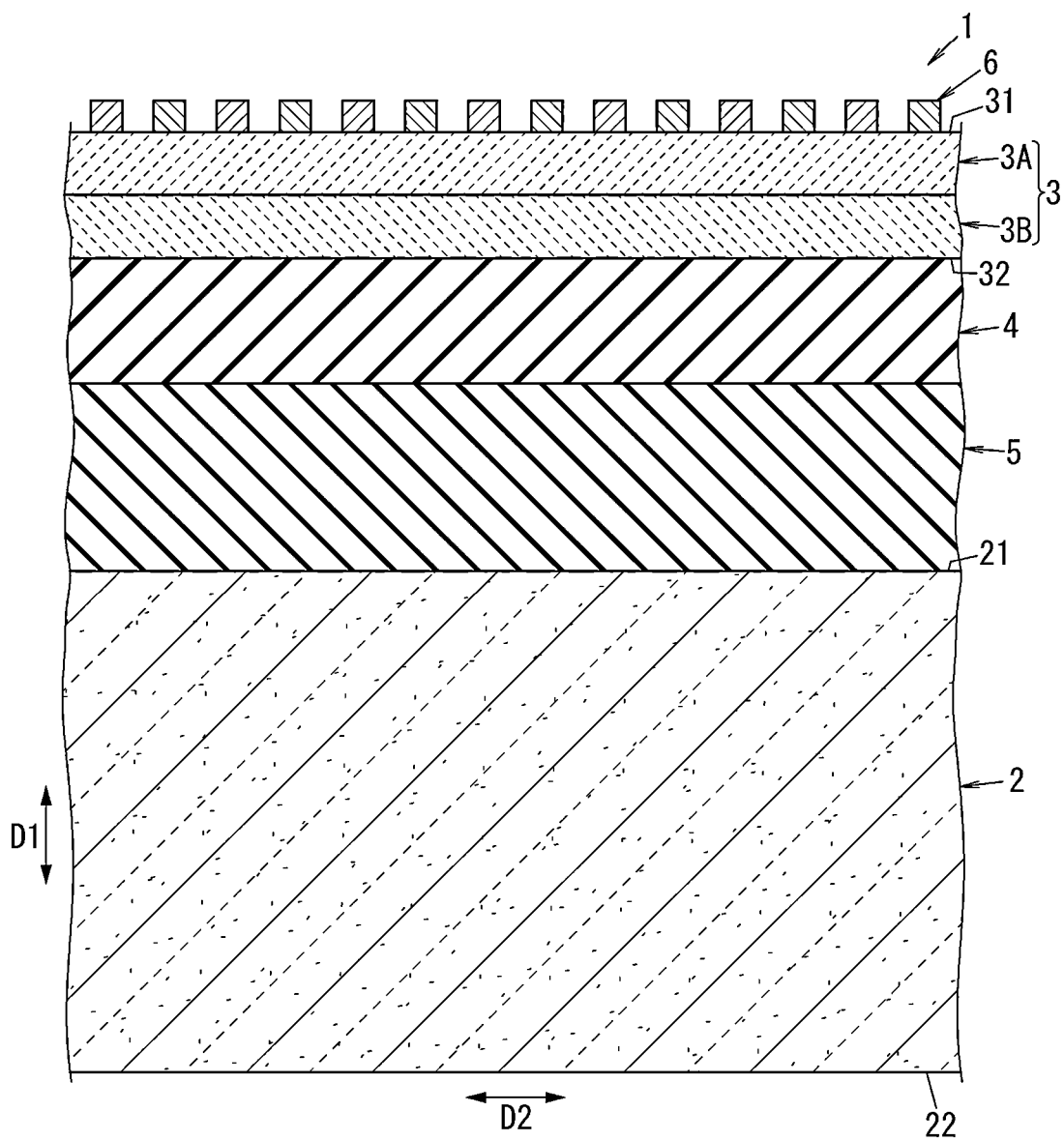
FIG. 2 is a sectional view of the acoustic wave device according to Preferred Embodiment 1 of the present invention taken along line X1-X1 in FIG. 1.

The acoustic wave device 1 according to Preferred Embodiment 1 includes a support substrate 2, a multilayer body 3, a low acoustic velocity film 4, a high acoustic velocity film 5, and an IDT (Interdigital Transducer) electrode 6 as illustrated in FIG. 1 and FIG. 2. The acoustic wave device 1 further includes two reflectors 7, a wiring portion 8, and a protective film (not illustrated).

(2) Elements of Acoustic Wave Device

Hereinafter, elements of the acoustic wave device 1 according to Preferred Embodiment 1 will be described with reference to the drawings.
(2.1) Support Substrate The support substrate 2 includes a first main surface 21 and a second main surface 22 opposed to each other as illustrated in FIG. 2. The first main surface 21 and the second main surface are opposed to each other in a thickness direction (first direction D1) of the support substrate 2. The support substrate 2 has a rectangular or substantially rectangular shape, for example, in a plan view from the thickness direction (first direction D1) of the support substrate 2. The shape of the support substrate 2 is not limited to a rectangular or substantially rectangular shape, and may be a square or substantially square shape, for example.

In the support substrate 2, an acoustic velocity of a bulk wave propagating through the support substrate 2 is higher than an acoustic velocity of an acoustic wave propagating through a first piezoelectric layer 3A and a second piezoelectric layer 3B. Here, the bulk wave propagating through the support substrate 2 is a bulk wave having a lowest acoustic velocity among bulk waves propagating through the support substrate 2.

The support substrate 2 is a silicon substrate, for example. A thickness of the support substrate 2 is preferably about 10λ (λ: wavelength of acoustic wave determined by electrode finger pitch P1 described later) or more and about 180 µm or less, and as an example, about 120 µm, for example. When the support substrate 2 is a silicon substrate, a plane orientation of the first main surface 21 of the support substrate 2 is a (100) plane, for example, but is not limited thereto, and may be a (110) plane or a (111) plane, for example. A propagation direction of an acoustic wave may be set without being restricted by the plane orientation of the first main surface 21 of the support substrate 2.

The material of the support substrate 2 is not limited to silicon. The support substrate 2 may include, for example, at least one material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.
(2.2) Multilayer Body The multilayer body 3 includes the first piezoelectric layer 3A and the second piezoelectric layer 3B as illustrated in FIG. 2. Further, the multilayer body 3 includes a first main surface 31 and a second main surface 32. The first main surface 31 and the second main surface 32 are opposed to each other in the thickness direction (first direction D1) of the support substrate 2. A thickness of the multilayer body 3 is the thickness between the first main surface 31 being a surface on a side of an IDT electrode 6 of the piezoelectric layer included in the multilayer body 3, and the second main surface 32 being a surface on a side of the support substrate 2 of the piezoelectric layer included in the multilayer body 3.
(2.3.1) First Piezoelectric Layer The first piezoelectric layer 3A is provided on the support substrate 2 with the second piezoelectric layer 3B interposed therebetween as illustrated in FIG. 2. More specifically, the first piezoelectric layer 3A is provided on a side of the first main surface 21 of the support substrate 2 with the second piezoelectric layer 3B, the low acoustic velocity film 4, and the high acoustic velocity film 5 interposed therebetween in the thickness direction (first direction D1) of the support substrate 2.

The first piezoelectric layer 3A is made of a Y-cut X-propagation LiTaO$_3$ piezoelectric single crystal, for example. When three crystal axes of an LiTaO$_3$ piezoelectric single crystal are denoted as an X-axis, a Y-axis, and a Z-axis, the Z-axis is rotated by θ1[°] in a direction from the Y-axis to the Z-axis with the X-axis as a center axis. The Y-cut X-propagation LiTaO$_3$ piezoelectric single crystal is obtained by cutting an LiTaO$_3$ piezoelectric single crystal along a plane on which normal line is the above rotated Z-axis, and is a single crystal on which a surface acoustic wave propagates in the X-axis direction. A cut angle of the first piezoelectric layer 3A is represented as θ1=Γ1+90° when the cut angle is denoted as Γ1[°] and Euler angles of the first piezoelectric layer 3A are denoted as (φ1, θ1, ψ1). Note that, Γ1 and Γ1±180λ n have the same meaning. Here, n is a natural number. The first piezoelectric layer 3A is not limited to the Y-cut X-propagation LiTaO$_3$ piezoelectric single crystal, and may be Y-cut X-propagation LiTaO$_3$ piezoelectric ceramics, for example.
(2.3.2) Second Piezoelectric Layer The second piezoelectric layer 3B is provided on the support substrate 2 as illustrated in FIG. 2. The expression "the second piezoelectric layer 3B is provided on the support substrate 2" includes a case that the second piezoelectric layer 3B is directly provided on the support substrate 2 with no other layer interposed therebetween, and a case that the second piezoelectric layer 3B is indirectly provided on the support substrate 2 with another layer interposed therebetween.

In the example of FIG. 2, the second piezoelectric layer 3B is indirectly provided on the support substrate 2. More specifically, the second piezoelectric layer 3B is provided on the side of the first main surface 21 of the support substrate 2 with the low acoustic velocity film 4 and the high acoustic velocity film 5 interposed therebetween in the thickness direction (first direction D1) of the support substrate 2.

The second piezoelectric layer 3B is made of a Y-cut X-propagation LiNbO$_3$ piezoelectric single crystal, for example. When three crystal axes of an LiNbO$_3$ piezoelectric single crystal are denoted as an X-axis, a Y-axis, and a Z-axis, the Z-axis is rotated by θ2[°] in a direction from the Y-axis to the Z-axis with the X-axis as a center axis. The Y-cut X-propagation LiNbO$_3$ piezoelectric single crystal is obtained by cutting an LiNbO$_3$ piezoelectric single crystal along a plane on which normal line is the above rotated Z-axis, and is a single crystal on which a surface acoustic wave propagates in the X-axis direction. A cut angle of the second piezoelectric layer 3B is represented as θ2=Γ2+90° when the cut angle is denoted as Γ2[°] and Euler angles of the second piezoelectric layer 3B are denoted as (φ2, θ2, ψ2). Note that, Γ2 and Γ2±180×n have the same meaning. Here, n is a natural number. The second piezoelectric layer 3B is not limited to the Y-cut X-propagation LiNbO$_3$ piezoelectric single crystal, and may be Y-cut X-propagation LiNbO$_3$ piezoelectric ceramics, for example.

(2.3.3) Total Film Thickness of First Piezoelectric Layer and Second Piezoelectric Layer The total thickness of the first piezoelectric layer 3A and the second piezoelectric layer 3B is, for example, approximately 3.5λ or less, when a wavelength of an acoustic wave determined by the electrode finger pitch P1 (see FIG. 1) of the IDT electrode 6 is denoted as λ. When the total thickness of the first piezoelectric layer 3A and the second piezoelectric layer 3B is about 3.5λ or less, the Q factor of the acoustic wave device 1 increases. Further, by setting the total thickness of the first piezoelectric layer 3A and the second piezoelectric layer 3B to about 2.5λ or less, a TCF (Temperature Coefficient of Frequency) may be lowered. Furthermore, by setting the total thickness of the first piezoelectric layer 3A and the second piezoelectric layer 3B to about 1.5λ or less, an acoustic velocity of an acoustic wave may easily be adjusted. For example, when the wavelength λ of an acoustic wave is about 2 µm, the total thickness of the first piezoelectric layer 3A and the second piezoelectric layer 3B is about 0.1λ (about 200 nm). The total thickness of the first piezoelectric layer 3A and the second piezoelectric layer 3B is not limited to about 3.5λ or less, and may be greater than about 3.5λ, for example.

When the total thickness of the first piezoelectric layer 3A and the second piezoelectric layer 3B is about 3.5λ or less, the Q factor increases as described above, but a higher-order mode is generated. In the acoustic wave device 1, even when the total thickness of the first piezoelectric layer 3A and the second piezoelectric layer 3B is about 3.5λ or less, the low acoustic velocity film 4 and the high acoustic velocity film 5 are provided to reduce the higher-order mode.

(2.3.4) Mode of Acoustic Wave Propagating through First Piezoelectric Layer and Second Piezoelectric Layer In the acoustic wave device 1, as a mode of an acoustic wave propagating through the first piezoelectric layer 3A, there is, for example, a longitudinal wave, an SH wave, an SV wave, or a mode in which these waves are combined. In the acoustic wave device 1, a mode having an SH wave as the main component is used as a main mode. The higher-order mode is a spurious mode generated on a higher frequency side relative to the main mode of an acoustic wave propagating through the first piezoelectric layer 3A. Whether or not the mode of an acoustic wave propagating through the first piezoelectric layer 3A is "the main mode having an SH wave as the main component" may be confirmed as follows, for example. A displacement distribution is analyzed by a finite element method using such as parameters (material, Euler angles, thickness, and the like) of the first piezoelectric layer 3A, parameters (material, Euler angles, thickness, and the like) of the second piezoelectric layer 3B, parameters (material, thickness, electrode finger pitch P1, and the like) of the IDT electrode 6, parameters (material, thickness, and the like) of the low acoustic velocity film 4, and parameters (material, thickness, and the like) of the high acoustic velocity film 5. Then strain is analyzed. The Euler angles of the first piezoelectric layer 3A may be obtained by analysis.

In the acoustic wave device 1, as a mode of an acoustic wave propagating through the second piezoelectric layer 3B, there is, for example, a longitudinal wave, an SH wave, an SV wave, or a mode in which these waves are combined. In the acoustic wave device 1, a mode having an SH wave as the main component is used as a main mode. The higher-order mode is a spurious mode generated on a higher frequency side relative to the main mode of an acoustic wave propagating through the second piezoelectric layer 3B. Whether or not the mode of the acoustic wave propagating through the second piezoelectric layer 3B is "the main mode having an SH wave as the main component" may be confirmed as follows, for example. A displacement distribution is analyzed by a finite element method using such as parameters (material, Euler angles, thickness, and the like) of the first piezoelectric layer 3A, parameters (material, Euler angles, thickness, and the like) of the second piezoelectric layer 3B, parameters (material, thickness, electrode finger pitch P1, and the like) of the IDT electrode 6, parameters (material, thickness, and the like) of the low acoustic velocity film 4, and parameters (material, thickness, and the like) of the high acoustic velocity film 5. Then strain is analyzed. The Euler angles of the second piezoelectric layer 3B may be obtained by analysis.

The acoustic wave device 1 is not limited to use a mode, having an SH wave as the main component, as the main mode in both the first piezoelectric layer 3A and the second piezoelectric layer 3B. In the first piezoelectric layer 3A and the second piezoelectric layer 3B, for example, a mode having an SH wave as the main component may be used as the main mode only in the first piezoelectric layer 3A, or a mode having an SH wave as the main component may be used as the main mode only in the second piezoelectric layer 3B. In short, in at least either one of the first piezoelectric layer 3A and the second piezoelectric layer 3B, a mode having an SH wave as the main component may be used as the main mode.

(2.4) Low Acoustic Velocity Film

The low acoustic velocity film 4 is provided on the support substrate 2 as illustrated in FIG. 2. The expression "the low acoustic velocity film 4 is provided on the support substrate 2" includes a case that the low acoustic velocity film 4 is directly provided on the support substrate 2 with no other layer interposed therebetween, and a case that the low acoustic velocity film 4 is indirectly provided on the support substrate 2 with another layer interposed therebetween.

In the example of FIG. 2, the low acoustic velocity film is provided between the support substrate 2 and the second piezoelectric layer 3B in the thickness direction (first direction D1) of the support substrate 2. More specifically, the low acoustic velocity film 4 is provided on the side of the first main surface 21 of the support substrate 2 with the high acoustic velocity film 5 interposed therebetween. The low acoustic velocity film 4 is a film in which an acoustic velocity of a bulk wave propagating through the low acoustic velocity film 4 is lower than an acoustic velocity of a bulk wave propagating through the first piezoelectric layer 3A and the second piezoelectric layer 3B.

Since the low acoustic velocity film 4 is provided between the support substrate 2 and the second piezoelectric layer 3B, an acoustic velocity of an acoustic wave will decrease. An acoustic wave inherently has a property that energy is concentrated in the medium having a low acoustic velocity. Accordingly, it is possible to increase the effect of confining the energy of an acoustic wave in the second piezoelectric layer 3B and the IDT electrode 6 in which the acoustic wave is excited. As a result, loss may be reduced and the Q factor of the acoustic wave device 1 may be increased in comparison with a case that the low acoustic velocity film 4 is not provided.

The material of the low acoustic velocity film 4 is silicon oxide, for example. The material of the low acoustic velocity film 4 is not limited to silicon oxide, and may be glass, silicon oxynitride, or tantalum oxide; a compound obtained by adding fluorine, carbon, or boron to silicon oxide; or a material including the materials above as a main component, for example.

When the low acoustic velocity film 4 is silicon oxide, temperature characteristics may be improved. The elastic constant of lithium tantalate has negative temperature characteristics, and the elastic constant of silicon oxide has positive temperature characteristics. Accordingly, the absolute value of the TCF of the acoustic wave device 1 may be lowered.

A thickness of the low acoustic velocity film 4 is preferably, for example, about 2.0λ or less, when a wavelength of an acoustic wave determined by the electrode finger pitch P1 described above is denoted as λ. For example, when the wavelength λ of an acoustic wave is about 2 μm, the thickness of the low acoustic velocity film 4 is about 0.2λ (about 400 nm). Setting the thickness of the low acoustic velocity film 4 to about 2.0λ or less makes it possible to reduce film stress. As a result, the warpage of a silicon wafer, from which the support substrate 2 is made, may be reduced at the time of manufacturing the acoustic wave device 1, and a non-defective rate may be increased and characteristics may be stabilized.

Further, the acoustic wave device 1 may include an adhesion layer interposed between the low acoustic velocity film 4 and the second piezoelectric layer 3B, for example. With this, adhesion property between the low acoustic velocity film 4 and the second piezoelectric layer 3B may be improved. The adhesion layer is made of resin (epoxy resin, polyimide resin, and the like), metal, or the like, for example. Further, the acoustic wave device 1 may include not only the adhesion layer but also a dielectric film between the low acoustic velocity film 4 and the second piezoelectric layer 3B, on the second piezoelectric layer 3B, or under the low acoustic velocity film 4.

(2.5) High Acoustic Velocity Film

The high acoustic velocity film 5 is provided on the support substrate 2 as illustrated in FIG. 2. The expression "the high acoustic velocity film 5 is provided on the support substrate 2" includes a case that the high acoustic velocity film 5 is directly provided on the support substrate 2 with no other layer interposed therebetween, and a case that the high acoustic velocity film 5 is indirectly provided on the support substrate 2 with another layer interposed therebetween.

In the example of FIG. 2, the high acoustic velocity film 5 is provided between the support substrate 2 and the low acoustic velocity film 4 in the thickness direction (first direction D1) of the support substrate 2. More specifically, the high acoustic velocity film 5 is provided on the side of the first main surface 21 of the support substrate 2. The high acoustic velocity film 5 is a film in which an acoustic velocity of a bulk wave propagating through the high acoustic velocity film 5 is higher than an acoustic velocity of an acoustic wave propagating through the first piezoelectric layer 3A and the second piezoelectric layer 3B.

The thickness of the high acoustic velocity film 5 is about 200 nm, about 300 nm, about 400 nm, or about 600 nm, for example. For example, when the wavelength λ of an acoustic wave is about 2 μm, the thickness of the high acoustic velocity film 5 is about 0.3λ (about 600 nm). With regard to the high acoustic velocity film 5, the thicker the thickness of the high acoustic velocity film 5 is, the more it becomes preferable, since the high acoustic velocity film 5 has a function to confine an acoustic wave in the first piezoelectric layer 3A, the second piezoelectric layer 3B, and the low acoustic velocity film 4.

The high acoustic velocity film 5 defines and functions to reduce or prevent leakage of the energy of an acoustic wave in the main mode to a structure below the high acoustic velocity film 5. In the acoustic wave device 1, when the high acoustic velocity film 5 is sufficiently thick, the energy of an acoustic wave in the main mode is distributed throughout the first piezoelectric layer 3A, the second piezoelectric layer 3B, and the low acoustic velocity film 4, and is distributed to a portion of the high acoustic velocity film 5 on a side of the low acoustic velocity film 4. Thus, the energy of an acoustic wave in the main mode is not distributed to the support substrate 2. The mechanism of confining an acoustic wave by the high acoustic velocity film 5 is the same as or similar to the mechanism of a case of a Love wave type surface wave being a non-leaky SH wave, and is described in a document "Introduction to Simulation Technologies for Surface Acoustic Wave Devices", Kenya Hashimoto, REALIZE Science & Engineering, pp. 26-28, for example. The mechanism described above is different from the mechanism of confining an acoustic wave using a Bragg reflector made of an acoustic multilayer film.

The material of the high acoustic velocity film 5 is silicon nitride, for example. The material of the high acoustic velocity film 5 is not limited to silicon nitride, and may be, for example, at least one material selected from the group consisting of diamond-like carbon, aluminum nitride, aluminum oxide, silicon carbide, silicon, sapphire, a piezoelectric body (lithium tantalate, lithium niobate, or quartz), alumina, zirconia, cordierite, mullite, steatite, forsterite, magnesia, and diamond. The material of the high acoustic velocity film 5 may be a material including any of the materials described above as a main component, or a material including a mixture that includes any of the materials described above as a main component.

(2.6) IDT Electrode

The IDT electrode 6 is provided on the first piezoelectric layer 3A as illustrated in FIG. 1 and FIG. 2. More specifically, the IDT electrode 6 is provided on the first main surface 31 of the multilayer body 3 in the thickness direction (first direction D1) of the support substrate 2.

The IDT electrode 6 includes two electrodes 61 as illustrated in FIG. 1. In other words, the IDT electrode 6 includes two busbars 62 and two sets of electrode fingers 63. More specifically, the IDT electrode 6 includes a first electrode 61A and a second electrode 61B. Each of the first electrode 61A and the second electrode 61B has conductivity. The first electrode 61A and the second electrode 61B are separated from each other and electrically insulated from each other.

The first electrode 61A has a comb shape in a plan view from the thickness direction (first direction D1) of the support substrate 2. The first electrode 61A includes a first busbar 62A and a plurality of first electrode fingers 63A. The first busbar 62A is a conductive portion to let the first electrode fingers 63A have the same electric potential (equipotential).

The second electrode 61B has a comb shape in a plan view from the thickness direction (first direction D1) of the support substrate 2. The second electrode 61B includes a second busbar 62B and a plurality of second electrode fingers 63B. The second busbar 62B is a conductive portion to let the second electrode fingers 63B have the same electric potential (equipotential). The first busbar 62A and the second busbar 62B face each other in a third direction D3 in the IDT electrode 6.

The first electrode fingers 63A are connected to the first busbar 62A and extend toward a side of the second busbar 62B. The first electrode fingers 63A are integrally provided with the first busbar 62A and are separated from the second busbar 62B.

The second electrode fingers 63B are connected to the second busbar 62B and extend toward a side of the first busbar 62A. The second electrode fingers 63B are integrally provided with the second busbar 62B and are separated from the first busbar 62A.

The IDT electrode 6 is a normal IDT electrode, for example. Hereinafter, the IDT electrode 6 will be described in more detail.

The first busbar 62A and the second busbar 62B of the IDT electrode 6 have an elongated shape of which longitudinal direction is a second direction D2. The first busbar 62A and the second busbar 62B of the IDT electrode 6 face each other in the third direction D3. The second direction D2 is the direction orthogonal or substantially orthogonal to the thickness direction (first direction D1) of the support substrate 2. The third direction D3 is the direction orthogonal or substantially orthogonal to both the thickness direction (first direction D1) of the support substrate 2 and the second direction D2.

The first electrode fingers 63A are connected to the first busbar 62A and extend toward the second busbar 62B. Here, the first electrode fingers 63A extend from the first busbar 62A along the third direction D3. Tip ends of the first electrode fingers 63A are spaced apart from the second busbar 62B. For example, the lengths of the first electrode fingers 63A are the same or substantially the same.

The second electrode fingers 63B are connected to the second busbar 62B and extend toward the first busbar 62A. Here, the second electrode fingers 63B extend from the second busbar 62B along the third direction D3. Tip ends of the second electrode fingers 63B are spaced apart from the first busbar 62A. For example, the lengths of the second electrode fingers 63B are the same or substantially the same. The lengths of the second electrode fingers 63B are the same or substantially the same as the lengths of the first electrode fingers 63A in the example of FIG. 1.

In the IDT electrode 6, the first electrode fingers 63A and the second electrode fingers 63B are alternately arranged one by one in the second direction D2 to be separated from each other. Accordingly, the first electrode finger 63A and the second electrode finger 63B adjacent to each other are spaced apart by a distance Si. The electrode fingers 63 as a group including the first electrode fingers 63A and the second electrode fingers 63B only need to have a configuration in which the first electrode fingers 63A and the second electrode fingers 63B are arranged side by side spaced apart from each other in the second direction D2, and may have a configuration in which the first electrode fingers 63A and the second electrode fingers 63B are not alternately arranged side by side spaced apart from each other. For example, there may be mixed a region in which the one first electrode finger 63A and the one second electrode finger 63B are arranged side by side spaced apart from each other, and a region in which the two first electrode fingers 63A or the two second electrode fingers 63B are arranged side by side in the second direction D2.

The first electrode fingers 63A and the second electrode fingers 63B are interdigitated with each other. The overlapping length of the first electrode finger 63A and the second electrode finger 63B when viewed in an acoustic wave propagation direction is an overlap width W1. That is, the IDT electrode 6 includes an overlap region determined by the first electrode fingers 63A and the second electrode fingers 63B. The overlap region is the region between an envelope of the tip ends of the first electrode fingers 63A and an envelope of the tip ends of the second electrode fingers 63B. The IDT electrode 6 excites an acoustic wave in the first piezoelectric layer 3A and the second piezoelectric layer 3B in the overlap region.

The IDT electrode 6 is not limited to a normal IDT electrode, and may be an apodization weighted IDT electrode or an inclined IDT electrode, for example. In an apodization weighted IDT electrode, the overlap width increases from one end portion toward a center in the propagation direction of an acoustic wave, and the overlap width decreases from the center toward the other end portion in the propagation direction of an acoustic wave.

The electrode finger pitch P1 of the IDT electrode 6 is defined, as illustrated in FIG. 1, by the distance between center lines of the two adjacent first electrode fingers 63A in the plurality of first electrode fingers 63A or the distance between center lines of the two adjacent second electrode fingers 63B in the plurality of second electrode fingers 63B. The distance between the center lines of the two adjacent second electrode fingers 63B is the same or substantially the same as the distance between the center lines of the two adjacent first electrode fingers 63A.

In the IDT electrode 6 of the acoustic wave device 1 according to Preferred Embodiment 1, the number of pairs of the first electrode finger 63A and the second electrode finger 63B is 100, as an example. That is, the IDT electrode 6 includes, as an example, 100 first electrode fingers 63A and 100 second electrode fingers 63B.

The material of the IDT electrode 6 is an appropriate metal material such as, for example, aluminum (Al), copper (Cu), platinum (Pt), gold (Au), silver (Ag), titanium (Ti), nickel (Ni), chromium (Cr), molybdenum (Mo), tungsten (W), or an alloy including any of these metals as a main body. Further, the IDT electrode 6 may have a structure in which metal films made of these metals or alloys are laminated.

(2.7) Reflector

The two reflectors 7 are provided on the first piezoelectric layer 3A as illustrated in FIG. 1. More specifically, the two reflectors 7 are provided on the first main surface 31 of the first piezoelectric layer 3A in the thickness direction (first direction D1) of the support substrate 2. Each of the two reflectors 7 has electrical conductivity.

The two reflectors 7 are respectively positioned on one side and the other side of the IDT electrode 6, in the direction (second direction D2) along a propagation direction of an acoustic wave of the acoustic wave device 1. In other words, the IDT electrode 6 is positioned between the two reflectors 7 in the second direction D2. Each reflector 7 is a short-circuit grating, for example. Each reflector 7 reflects an acoustic wave.

Each of the two reflectors 7 includes a plurality of electrode fingers 71. One ends of the plurality of electrode fingers 71 are short-circuited, and the other ends are short-circuited. In each of the two reflectors 7, the number of electrode fingers is 20, as an example.

The material of each reflector 7 is an appropriate metal material such as, for example, aluminum (Al), copper (Cu), platinum (Pt), gold (Au), silver (Ag), titanium (Ti), nickel (Ni), chromium (Cr), molybdenum (Mo), tungsten (W), or an alloy including any of these metals as a main body.

Further, each reflector 7 may have a structure in which a plurality of metal films made of these metals or alloys are laminated.

In the acoustic wave device 1, in a case that each reflector 7 and the IDT electrode 6 are made of the same material and have the same or substantially the same thickness, it is possible to form each reflector 7 and the IDT electrode 6 in the same process at the time of manufacturing the acoustic wave device 1.

Each reflector 7 is a short-circuit grating in the acoustic wave device 1 according to Preferred Embodiment 1, but is not limited thereto. Each reflector 7 may be an open grating, a positive-negative reflection type grating, or a grating in which a short-circuit grating and an open grating are combined, for example.

(2.8) Wiring Portion

The wiring portion 8 is provided on the first piezoelectric layer 3A as illustrated in FIG. 1. More specifically, the wiring portion 8 is provided on the first main surface 31 of the multilayer body 3 in the thickness direction (first direction D1) of the support substrate 2. The wiring portion 8 has electrical conductivity.

The wiring portion 8 includes a first wiring portion 81 and a second wiring portion 82. The first wiring portion 81 is connected to the first busbar 62A of the IDT electrode 6. The second wiring portion 82 is connected to the second busbar 62B of the IDT electrode 6. The first wiring portion 81 and the second wiring portion 82 are spaced apart from each other and electrically insulated from each other.

The first wiring portion 81 extends from the first busbar 62A to a side opposite to the plurality of first electrode fingers 63A. The first wiring portion 81 may partially overlap with the first busbar 62A in the thickness direction (first direction D1) of the support substrate 2, or may be integrally provided with the first busbar 62A with the same material and the same or substantially the same thickness as the first busbar 62A.

The second wiring portion 82 extends from the second busbar 62B to a side opposite to the plurality of second electrode fingers 63B. The second wiring portion 82 may partially overlap with the second busbar 62B in the thickness direction (first direction D1) of the support substrate 2, or may be integrally provided with the second busbar 62B with the same material and the same or substantially the same thickness as the second busbar 62B.

The material of the wiring portion 8 is an appropriate metal material such as, for example, aluminum (Al), copper (Cu), platinum (Pt), gold (Au), silver (Ag), titanium (Ti), nickel (Ni), chromium (Cr), molybdenum (Mo), tungsten (W), or an alloy including any of these metals as a main body. Further, the wiring portion 8 may have a structure in which metal films made of these metals or alloys are laminated.

(2.9) Protective Film

A protective film (not illustrated) is provided on the first piezoelectric layer 3A. The protective film covers the IDT electrode 6, the reflectors 7, and the wiring portion 8 on the first main surface 31 of the multilayer body 3, and a portion of the first main surface 31 of the multilayer body 3.

The material of the protective film is silicon oxide, for example. The material of a protective film is not limited to silicon oxide, and may be silicon nitride, for example. The protective film is not limited to a single layer structure, and may have a multilayer structure including two or more layers, for example.

(3) Characteristics of Acoustic Wave Device

Hereinafter, characteristics of the acoustic wave device according to Preferred Embodiment 1 will be described in comparison with an acoustic wave device of a comparative example with reference to the drawings.

Figure 3:
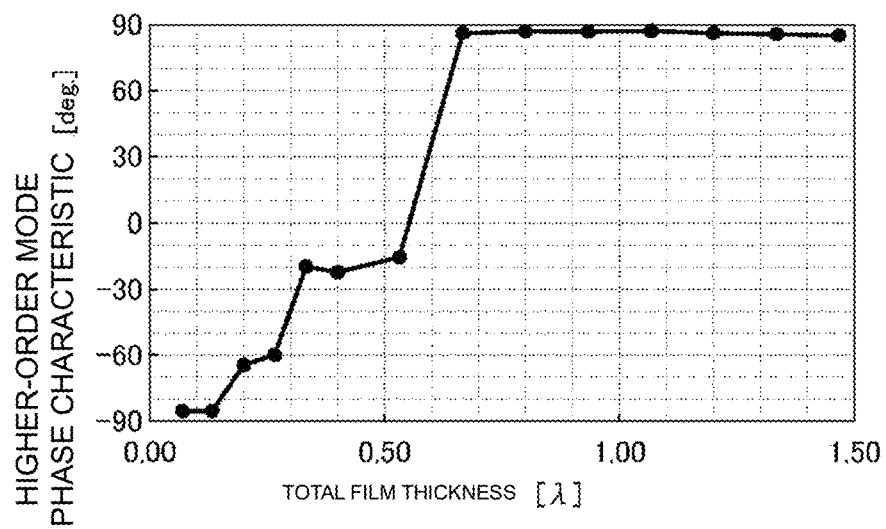
FIG. 3 is a graph illustrating a phase characteristic of a higher-order mode of the acoustic wave device according to Preferred Embodiment 1 of the present invention.

First, in the acoustic wave device of the comparative example, since the total film thickness of the first piezoelectric layer 3A and the second piezoelectric layer 3B is larger than about 0.66λ, the phase characteristic of the higher-order mode is large as illustrated in FIG. 3.

Whereas, in the acoustic wave device 1 according to Preferred Embodiment 1, since the total film thickness of the first piezoelectric layer 3A and the second piezoelectric layer 3B is about 0.66λ or less, the phase characteristic of the higher-order mode is small as illustrated in FIG. 3.

Conditions to achieve the characteristics in FIG. 3 for the acoustic wave device 1 are as follows. The thickness of the IDT electrode 6 is about 0.05λ, the thickness of the low acoustic velocity film 4 is about 0.15λ, and the thickness of the high acoustic velocity film 5 is about 0.15λ. The material of the IDT electrode 6 is aluminum, the material of the low acoustic velocity film 4 is silicon oxide, the material of the high acoustic velocity film 5 is silicon nitride, and the material of the support substrate 2 is silicon. A second Euler angle θ1 of the first piezoelectric layer 3A is about 130°, and a second Euler angle θ2 of the second piezoelectric layer 3B is about 50°. In a state that a ratio (T1/T2), which is the ratio of a thickness T1 of the first piezoelectric layer 3A to a thickness T2 of the second piezoelectric layer 3B, is fixed to 3, the total film thickness of the first piezoelectric layer 3A and the second piezoelectric layer 3B is varied.

As illustrated in FIG. 3, the total film thickness of the first piezoelectric layer 3A and the second piezoelectric layer 3B is preferably about 0.33λ or less, for example. With this, the phase characteristic of the higher-order mode may further be lowered.

Further, the total thickness of the first piezoelectric layer 3A and the second piezoelectric layer 3B is more preferably about 0.2λ or less, for example. With this, the phase characteristic of the higher-order mode may still further be lowered.

Figure 13:
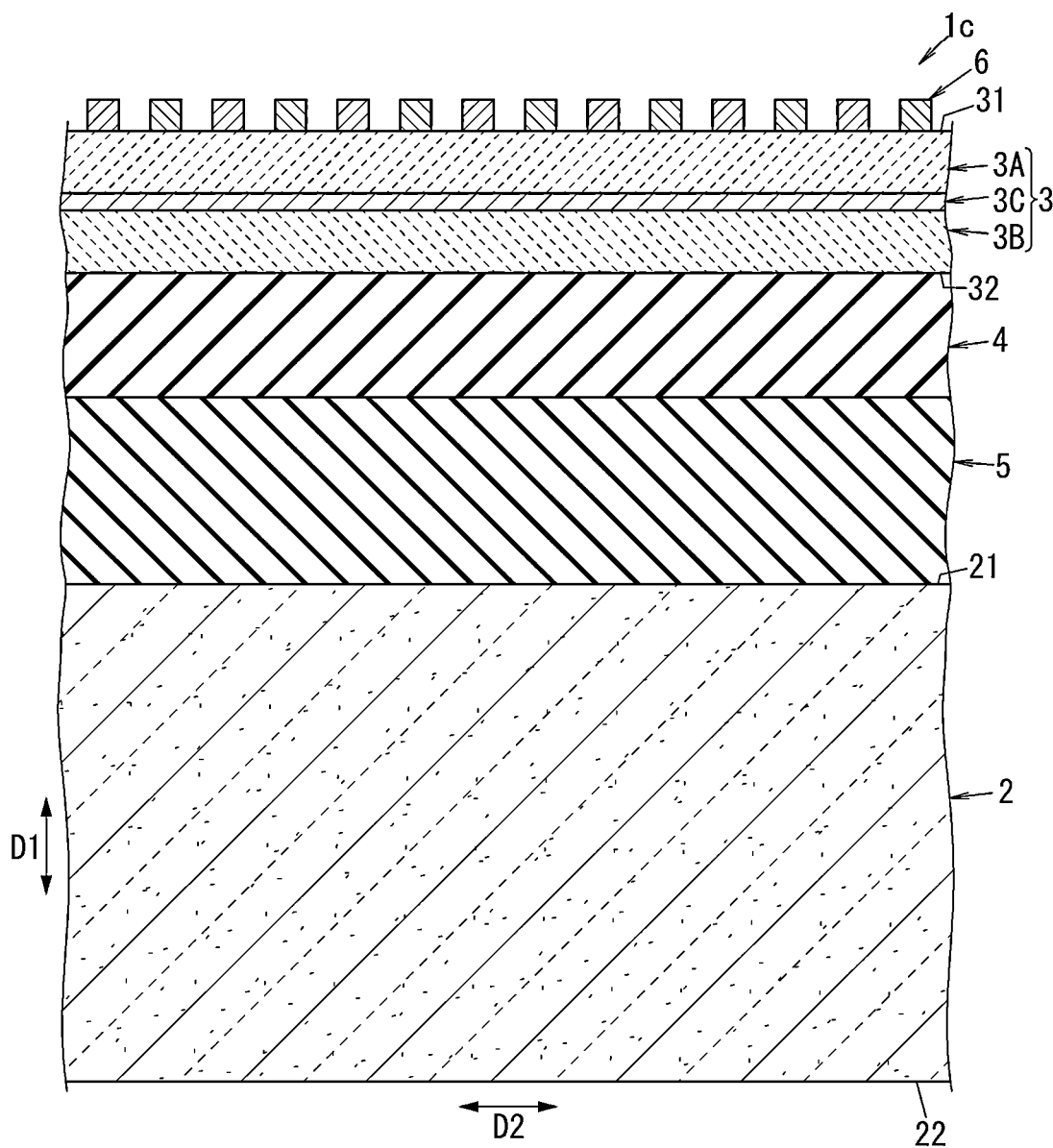
FIG. 13 is a sectional view of an acoustic wave device in which an intermediate layer is inserted.

An intermediate layer 3C including silicon oxide or silicon nitride, for example, may be inserted between the first piezoelectric layer 3A and the second piezoelectric layer 3B as in an acoustic wave device 1c in FIG. 13. The thickness of the intermediate layer is approximately 1 nm to approximately 30 nm, for example. In particular, when the intermediate layer is made of silicon oxide, frequency-temperature characteristics may be improved.

Figure 4A:
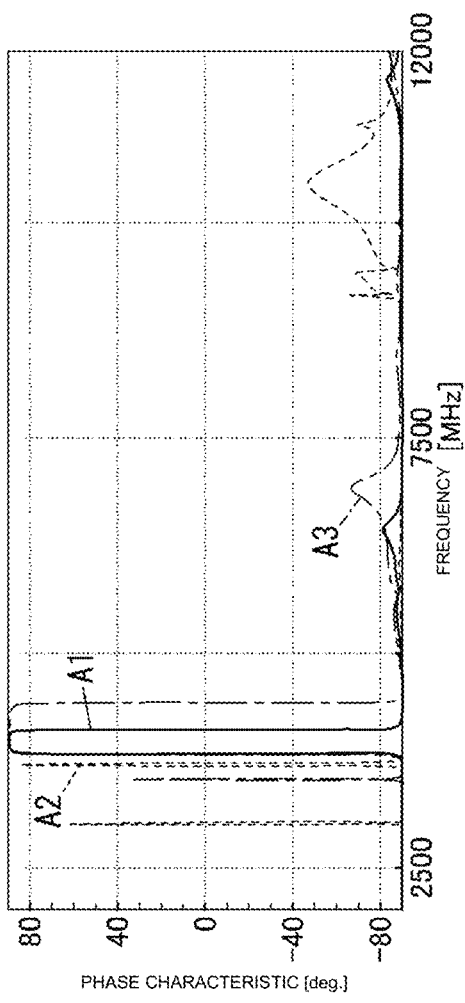
FIG. 4A is a graph illustrating a phase characteristic of the acoustic wave device according to Preferred Embodiment 1 of the present invention.
Figure 4C:
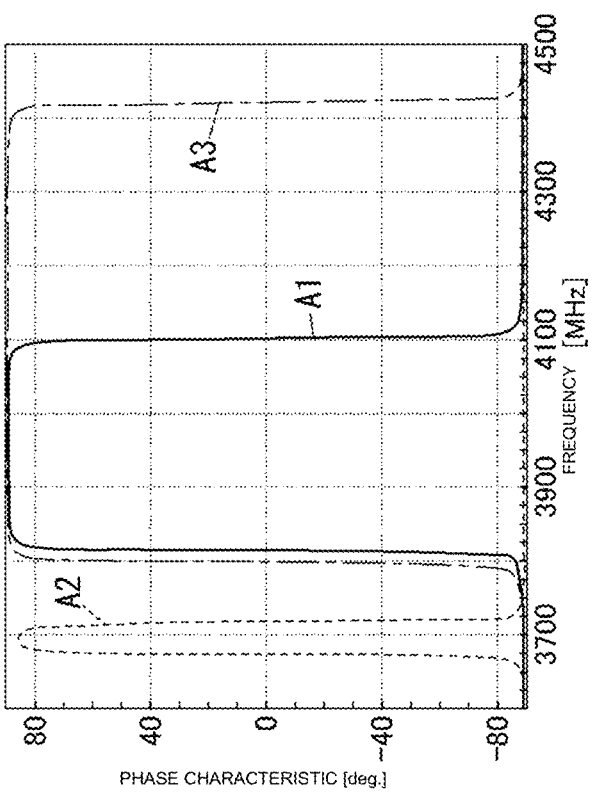
FIG. 4C is a graph illustrating a phase characteristic of the same acoustic wave device in a main mode.
Figure 4B:
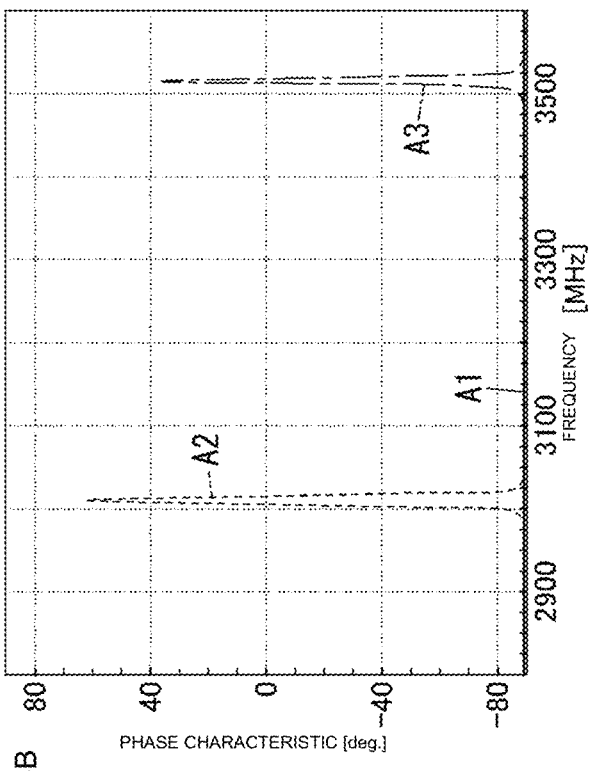
FIG. 4B is a graph illustrating a phase characteristic of the same acoustic wave device in a Rayleigh mode.

FIGS. 4A to 4C illustrate a phase characteristic A1 of the acoustic wave device 1 according to Preferred Embodiment 1, a phase characteristic A2 of an acoustic wave device of Comparative Example 1, and a phase characteristic A3 of an acoustic wave device of Comparative Example 2. FIG. 4B is an enlarged view of the low frequency band (Rayleigh spurious response) in FIGS. 4A and 4C is an enlarged view of the main mode in FIG. 4A.

In the acoustic wave device 1 according to Preferred Embodiment 1, the first piezoelectric layer 3A is a lithium tantalate piezoelectric layer, and the second piezoelectric layer 3B is a lithium niobate piezoelectric layer. The acoustic wave device of Comparative Example 1 is an acoustic wave device in which the piezoelectric layer is only a lithium tantalate piezoelectric layer. The acoustic wave device of Comparative Example 2 is an acoustic wave device in which the piezoelectric layer is only a lithium niobate piezoelectric layer. The Euler angles of the first piezoelectric layer 3A are denoted as (0, θ1, 0), and the Euler angles of the second piezoelectric layer 3B are denoted as (0, θ2, 0). Then the phase characteristic A1 in FIGS. 4A to 4C is the phase characteristic in a case that the second Euler angle θ1 is about 0° and the second Euler angle θ2 is about −70° in the acoustic wave device 1 according to Preferred Embodiment 1. The phase characteristic A2 is the phase characteristic of the acoustic wave device of Comparative Example 1 in a case that the second Euler angle θ1 is about 0°. The phase characteristic A3 is the phase characteristic of the acoustic wave device of Comparative Example 2 in a case that the second Euler angle θ2 is about −70°.

As illustrated in FIG. 4A, the phase characteristic A1 of the acoustic wave device 1 according to Preferred Embodiment 1 is improved in a frequency band excluding the frequency band of the main mode, compared with the phase characteristic A2 of the acoustic wave device of Comparative Example 1 and the phase characteristic A3 of the acoustic wave device of Comparative Example 2.

In particular, as illustrated in FIG. 4B, the acoustic wave device 1 according to Preferred Embodiment 1 may reduce the Rayleigh mode spurious response in the lower frequency side relative to the frequency band of the main mode, compared with the acoustic wave devices of Comparative Example 1 and Comparative Example 2. Whereas, as illustrated in FIG. 4C, also in the acoustic wave device 1 according to Preferred Embodiment 1, the characteristic of the main mode is achieved to the same or substantially the same extent as those of the acoustic wave devices of Comparative Example 1 and Comparative Example 2.

Conditions to achieve the phase characteristic A1 in FIGS. 4A to 4C for the acoustic wave device 1 are as follows. The thickness of the IDT electrode 6 is about 0.05λ, the thickness of the first piezoelectric layer 3A is about 0.05λ, the thickness of the second piezoelectric layer 3B is about 0.15λ, the thickness of the low acoustic velocity film 4 is about 0.15λ, and the thickness of the high acoustic velocity film 5 is about 0.15λ. The material of the IDT electrode 6 is aluminum, the material of the low acoustic velocity film 4 is silicon oxide, the material of the high acoustic velocity film 5 is silicon nitride, and the material of the support substrate 2 is silicon. In the acoustic wave device of Comparative Example 1, the thickness of the IDT electrode is about 0.05λ, the thickness of the first piezoelectric layer is about 0.2λ, the thickness of the low acoustic velocity film is about 0.15λ, and the thickness of the high acoustic velocity film is about 0.15λ. The material of the IDT electrode is aluminum, the material of the low acoustic velocity film is silicon oxide, the material of the high acoustic velocity film is silicon nitride, and the material of the support substrate is silicon. In the acoustic wave device of Comparative Example 2, the thickness of the IDT electrode is about 0.05λ, the thickness of the second piezoelectric layer is about 0.2λ, the thickness of the low acoustic velocity film is about 0.15λ, and the thickness of the high acoustic velocity film is about 0.15λ. The material of the IDT electrode is aluminum, the material of the low acoustic velocity film is silicon oxide, the material of the high acoustic velocity film is silicon nitride, and the material of the support substrate is silicon.

(4) Advantageous Effects

In the acoustic wave device 1 according to Preferred Embodiment 1, the multilayer body 3 including the first piezoelectric layer 3A (lithium tantalate piezoelectric layer) and the second piezoelectric layer 3B (lithium niobate piezoelectric layer) has the thickness of about 0.66λ or less, for example. Here, the thickness of the multilayer body 3 is the thickness between the first main surface 31 being the surface, of the piezoelectric layer included in the multilayer body 3, on the side of the IDT electrode 6; and the second main surface 32 being the surface, of the piezoelectric layer included in the multilayer body 3, on the side of the support substrate 2. With this, it is possible to reduce or prevent a Rayleigh mode spurious response generated in a band of a lower frequency side relative to an excitation mode used to achieve the characteristics, and to reduce a higher-order mode spurious response generated in a band of a higher frequency side relative to the excitation mode. Further, when the acoustic wave device 1 is used as a filter, it is possible to reduce or prevent a Rayleigh mode spurious response generated in a lower frequency band side relative to the pass band of the filter, and to reduce a higher-order mode spurious response generated in a higher frequency band side relative to the pass band of the filter.

In the acoustic wave device 1 according to Preferred Embodiment 1, the first piezoelectric layer 3A (lithium tantalate piezoelectric layer) is laminated on the side of the IDT electrode 6, and the second piezoelectric layer 3B (lithium niobate piezoelectric layer) is laminated on the side of the support substrate 2. With this, temperature characteristics may be improved.

In the acoustic wave device 1 according to Preferred Embodiment 1, at least either one of the first piezoelectric layer 3A (lithium tantalate piezoelectric layer) and the second piezoelectric layer 3B (lithium niobate piezoelectric layer) is rotated Y-cut. With this, an SH wave may more efficiently be excited, and the usability is high.

In the acoustic wave device 1 according to Preferred Embodiment 1, both of the first piezoelectric layer 3A (lithium tantalate piezoelectric layer) and the second piezoelectric layer 3B (lithium niobate piezoelectric layer) are rotated Y-cut. With this, an SH wave may more efficiently be excited.

In the acoustic wave device 1 according to Preferred Embodiment 1, the low acoustic velocity film 4 is provided between the support substrate 2 and the multilayer body 3 in the thickness direction (first direction D1) of the support substrate 2. With this, the Q factor of the acoustic wave device 1 may be improved.

In the acoustic wave device 1 according to Preferred Embodiment 1, the high acoustic velocity film 5 is provided between the support substrate 2 and the low acoustic velocity film 4 in the thickness direction (first direction D1) of the support substrate 2. With this, the Q factor of the acoustic wave device 1 may further be improved.

(5) Modification

Hereinafter, a modification of Preferred Embodiment 1 will be described.

The acoustic wave device 1 may include, for example, an adhesion layer, a dielectric film, or the like as films other than the high acoustic velocity film 5, the low acoustic velocity film 4, the first piezoelectric layer 3A, and the second piezoelectric layer 3B.

The acoustic wave device 1 according to the modification described above also provides advantageous effects the same as or similar to those of the acoustic wave device 1 according to Preferred Embodiment 1.

Preferred Embodiment 2

An acoustic wave device 1 according to Preferred Embodiment 2 of the present invention is different from the acoustic wave device 1 according to Preferred Embodiment 1 in that the electromechanical coupling coefficient is, for example, about 4.0% or more. With regard to the acoustic wave device 1 according to Preferred Embodiment 2, the same or corresponding elements as those of the acoustic wave device 1 according to Preferred Embodiment 1 are denoted by the same reference signs, and the description thereof will be omitted.

(1) Configuration

In the acoustic wave device 1 according to Preferred Embodiment 2, the Euler angles of the first piezoelectric layer 3A and the Euler angles of the second piezoelectric layer 3B are set such that the electromechanical coupling coefficient is, for example, about 4.0% or more. In a case that the second Euler angle θ1 of the first piezoelectric layer 3A is about 0° or more and 180° or less, and the second Euler angle θ2 of the second piezoelectric layer 3B is about 0° or more and less than about 180°; the electromechanical coupling coefficient is represented as the following Expression (1). In a case that the second Euler angle θ1 of the first piezoelectric layer 3A is about 0° or more and about 180° or less, and the second Euler angle θ2 of the second piezoelectric layer 3B is about −180° or more and less than about 0°; the electromechanical coupling coefficient is represented as the following Expression (2). Expression (1) and Expression (2) are expressions in which the electromechanical coupling coefficient is multiplied by 100. The second Euler angle θ1 satisfies θ1=θ1+180°×n (n=0, ±1, ±2). With regard to the first piezoelectric layer 3A and the second piezoelectric layer 3B of Preferred Embodiment 2, the description of the same configuration and function as those of the first piezoelectric layer 3A and the second piezoelectric layer 3B of Preferred Embodiment 1 will be omitted.

$$
\begin{aligned}
&6.10489714829633 + \\
&(-1.33487064946561) \times \left(\frac{T1}{T2} - 1.44444444433333\right) + \\
&0.0751823042830098 \times (\theta 1 - 90) + \\
&0.083704332683124 \times (\theta 2 - 90) + \\
&0.927428408819691 \times \left\{\left(\frac{T1}{T2} - 1.44444444433333\right) \times \right.\\
&\left.\left(\frac{T1}{T2} - 1.44444444433333\right) - 1.28395061753088\right\} + \\
&(-0.00144447241419258) \times \{(\theta 1 - 90) \times (\theta 1 - 90) - 3000\} + \\
&(-0.0000077475616075308) \times \\
&\{(\theta 1 - 90) \times (\theta 1 - 90) \times (\theta 1 - 90) - 0\} + \\
&0.0000000903853423589 \times \\
&\{(\theta 1 - 90) \times (\theta 1 - 90) \times (\theta 1 - 90) \times (\theta 1 - 90) - 16140000\} + \\
&(-0.00143615455366066) \times \{(\theta 2 - 90) \times (\theta 2 - 90) - 3000\} + \\
&(-0.0000084727694286792) \times \\
&\{(\theta 2 - 90) \times (\theta 2 - 90) \times (\theta 2 - 90) - 0\} + \\
&0.0000000922825081781 \times \\
&\{(\theta 2 - 90) \times (\theta 2 - 90) \times (\theta 2 - 90) \times (\theta 2 - 90) - 16140000\} + \\
&(-0.0136937600766242) \times \left(\frac{T1}{T2} - 1.44444444433333\right) \times \\
&(\theta 2 - 90) + 0.000272045866480268 \times (\theta 1 - 90) \times (\theta 2 - 90)
\end{aligned}
$$

Expression (1)

$$
\begin{aligned}
&2.6203567327276 + \\
&(-0.891540666255983) \times \left(\frac{T1}{T2} - 1.44444444433333\right) + \\
&0.0251129624812418 \times (\theta 1 - 90) + \\
&0.026901842780151 \times (\theta 2 - (-90)) + \\
&1.29138198424116 \times \left\{\left(\frac{T1}{T2} - 1.44444444433333\right) \times \right.\\
&\left.\left(\frac{T1}{T2} - 1.44444444433333\right) - 1.28395061753088\right\} + \\
&0.000030767162653015 \times \{(\theta 1 - 90) \times (\theta 1 - 90) - 3000\} + \\
&(-0.0000053634747902267) \times \\
&\{(\theta 1 - 90) \times (\theta 1 - 90) \times (\theta 1 - 90) - 0\} + \\
&(-0.000397017013538763) \times \\
&\{(\theta 2 - (-90)) \times (\theta 2 - (-90)) - 3000\} + \\
&(-0.000006110078359279) \times \\
&\{(\theta 2 - (-90)) \times (\theta 2 - (-90)) \times (\theta 2 - (-90)) - 0\} + \\
&0.0000000559880444857 \times \\
&\{(\theta 2 - (-90)) \times (\theta 2 - (-90)) \times (\theta 2 - (-90)) \times (\theta 2 - (-90)) - \\
&16140000\} + 0.0110300006478456 \times \\
&\left(\frac{T1}{T2} - 1.44444444433333\right) \times (\theta 1 - 90) + \\
&(-0.00503930615559755) \times \\
&\left(\frac{T1}{T2} - 1.44444444433333\right) \times (\theta 2 - (-90)) + \\
&(-0.00025434331383419) \times (\theta 1 - 90) \times (\theta 2 - (-90))
\end{aligned}
$$

Expression (2)

(2) Characteristics of Acoustic Wave Device

Figure 5A:
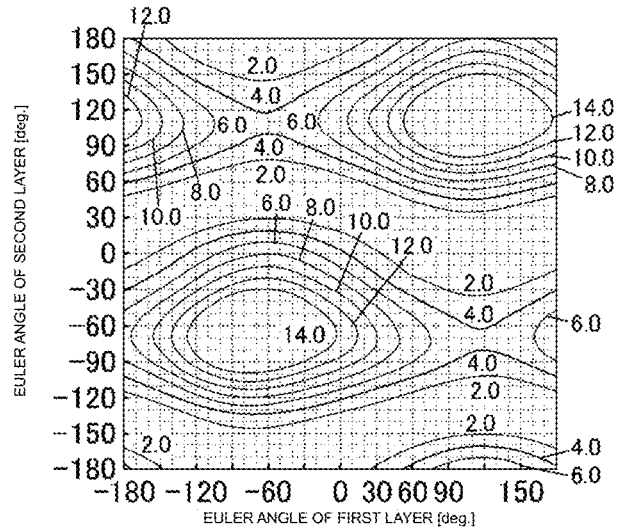
FIGS. 5A to 5C are contour maps illustrating an electromechanical coupling coefficient characteristic in an acoustic wave device according to Preferred Embodiment 2 of the present invention.
Figure 5B:
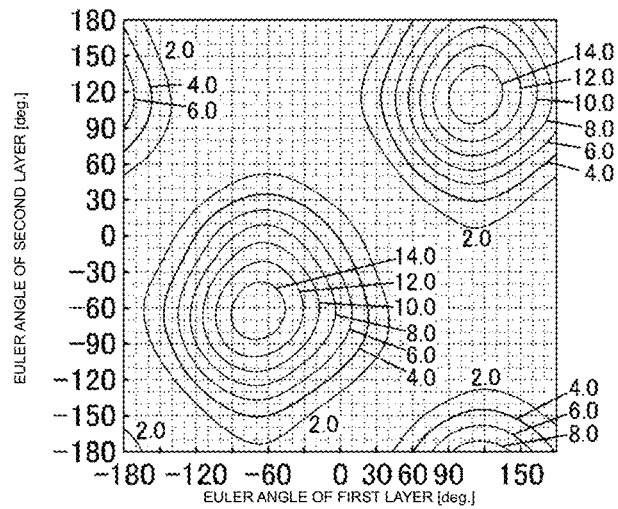
Figure 5C:
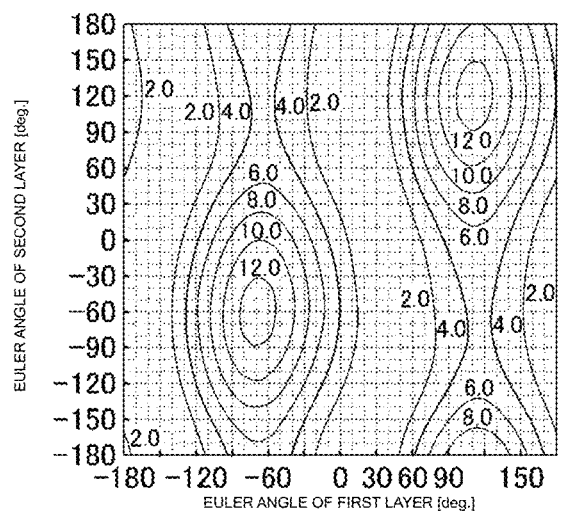

FIGS. 5A to 5C illustrate the electromechanical coupling coefficient characteristic when the ratio (T1/T2), which is the ratio of the thickness T1 of the first piezoelectric layer 3A to the thickness T2 of the second piezoelectric layer 3B, is varied. In each of FIGS. 5A to 5C, the "Euler angle of first layer" is the second Euler angle θ1 in the Euler angles (0, θ1, 0) of the first piezoelectric layer 3A, and the "Euler angle of second layer" is the second Euler angle θ2 in the Euler angles (0, θ2, 0) of the second piezoelectric layer 3B. Conditions to achieve the electromechanical coupling coefficient characteristic in FIGS. 5A to 5C for the acoustic wave device 1 are as follows. The thickness of the IDT electrode 6 is about 0.05λ, the thickness of the low acoustic velocity film 4 is about 0.15λ, and the thickness of the high acoustic velocity film 5 is about 0.15λ. The material of the IDT electrode 6 is aluminum, the material of the low acoustic velocity film 4 is silicon oxide, the material of the high acoustic velocity film 5 is silicon nitride, and the material of the support substrate 2 is silicon.

FIG. 5A illustrates the electromechanical coupling coefficient characteristic when the ratio (T1/T2) is about 0.33. For example, the thickness T1 of the first piezoelectric layer 3A is about 0.05λ, and the thickness T2 of the second piezoelectric layer 3B is about 0.15λ. By selecting a combination of the second Euler angles θ1 and θ2 such that the electromechanical coupling coefficient is about 4.0% or more, preferable characteristics may be achieved.

FIG. 5B illustrates the electromechanical coupling coefficient characteristic when the ratio (T1/T2) is about 1. For example, the thickness T1 of the first piezoelectric layer 3A and the thickness T2 of the second piezoelectric layer 3B are both about 0.10λ. As in the case that the ratio (T1/T2) is about 0.33, by selecting a combination of the second Euler angles θ1 and θ2 such that the electromechanical coupling coefficient is about 4.0% or more, preferable characteristics may be achieved.

FIG. 5C illustrates the electromechanical coupling coefficient characteristic when the ratio (T1/T2) is about 3. For example, the thickness T1 of the first piezoelectric layer 3A is about 0.15λ, and the thickness T2 of the second piezoelectric layer 3B is about 0.05λ. As in the case that the ratio (T1/T2) is about 0.33, by selecting a combination of the second Euler angles θ1 and θ2 such that the electromechanical coupling coefficient is about 4.0% or more, preferable characteristics may be achieved.

(3) Advantageous Effects

The acoustic wave device 1 according to Preferred Embodiment 2 has the electromechanical coupling coefficient of about 4.0% or more. With this, the main mode having an SH wave as the main component may efficiently be excited, and thus preferable characteristics may be achieved. Note that, as described above, Expression (1) and Expression (2) are expressions for the calculation of the electromechanical coupling coefficient in percentage. For this reason, the second Euler angle θ1 and the second Euler angle θ2 are values such that the electromechanical coupling coefficients represented as Expression (1) and Expression (2) are about 4.0% or more.

Preferred Embodiment 3

The acoustic wave device 1 according to Preferred Embodiment 3 of the present invention is different from the acoustic wave device 1 according to Preferred Embodiment 1 in that the absolute value of the TCF is, for example, about 20 ppm/° C. or less. Note that, with regard to the acoustic wave device 1 according to Preferred Embodiment 3, the same or corresponding elements as those of the acoustic wave device 1 according to Preferred Embodiment 1 are denoted by the same reference signs, and the description thereof will be omitted.

(1) Configuration

In the acoustic wave device 1 according to Preferred Embodiment 3, the Euler angles of the first piezoelectric layer 3A and the Euler angles of the second piezoelectric layer 3B are set such that the absolute value of the TCF is about 20 ppm/° C. or less. In a case that the second Euler angle θ1 of the first piezoelectric layer 3A is about 0° or more and about 180° or less, and the second Euler angle θ2 of the second piezoelectric layer 3B is about 0° or more and less than about 180°; the TCF is represented as the following Expression (5). In a case that the second Euler angle θ1 of the first piezoelectric layer 3A is about 0° or more and about 180° or less, and the second Euler angle θ2 of the second piezoelectric layer 3B is about −180° or more and less than about 0°; the TCF is represented as the following Expression (6). With regard to the first piezoelectric layer 3A and the second piezoelectric layer 3B of Preferred Embodiment 3, the description of the same configuration and function as those of the first piezoelectric layer 3A and the second piezoelectric layer 3B of Preferred Embodiment 1 will be omitted.

$$\begin{aligned}&(-14.8326541312623) + \\ &5.9468925587845 \times \left(\frac{T1}{T2} - 1.44444444433333\right) + \\ &0.543285669216811 \times (\theta 1 - 90) + \\ &(-0.0289565650225207) \times (\theta 2 - 90) + \\ &(-2.78596009856013) \times \left\{\left(\frac{T1}{T2} - 1.44444444433333\right) \times \right. \\ &\left. \left(\frac{T1}{T2} - 1.44444444433333\right) - 1.28395061753088\right\} + \\ &(-0.00289637570199324) \times \{(\theta 1 - 90) \times (\theta 1 - 90) - 3000\} + \\ &(-0.000117601847921907) \times \\ &\{(\theta 1 - 90) \times (\theta 1 - 90) \times (\theta 1 - 90) - 0\} + \\ &0.0000002606431101102 \times \\ &\{(\theta 1 - 90) \times (\theta 1 - 90) \times (\theta 1 - 90) \times (\theta 1 - 90) - 16140000\} + \\ &0.0000000058278132228 \times \{(\theta 1 - 90) \times \\ &(\theta 1 - 90) \times (\theta 1 - 90) \times (\theta 1 - 90) \times (\theta 1 - 90) - 0\} + \\ &0.000720583879743022 \times \{(\theta 2 - 90) \times (\theta 2 - 90) - 3000\} + \\ &(-0.000456726259950784) \times (\theta 1 - 90) \times (\theta 2 - 90)\end{aligned}$$

Expression (5)

$$\begin{aligned}&2.6203567327276 + \\ &(-0.891540666255983) \times \left(\frac{T1}{T2} - 1.44444444433333\right) + \\ &0.0251129624812418 \times (\theta 1 - 90) + \\ &1.29138198424116 \times \left\{\left(\frac{T1}{T2} - 1.44444444433333\right) \times \right. \\ &\left. \left(\frac{T1}{T2} - 1.44444444433333\right) - 1.28395061753088\right\} + \\ &0.0000030767162653015 \times \{(\theta 1 - 90) \times (\theta 1 - 90) - 3000\} + \\ &(-0.0000053634747902267) \times \\ &\{(\theta 1 - 90) \times (\theta 1 - 90) \times (\theta 1 - 90) - 0\} + \\ &0.0110300006478456 \times \\ &\left(\frac{T1}{T2} - 1.44444444433333\right) \times (\theta 1 - 90)\end{aligned}$$

Expression (6)

(2) Characteristics of Acoustic Wave Device

Figure 6A:
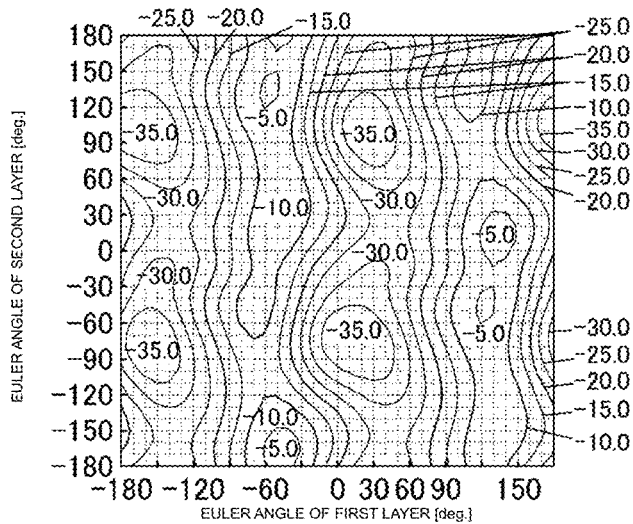
FIGS. 6A to 6C are contour maps illustrating a TCF characteristic in an acoustic wave device according to Preferred Embodiment 3 of the present invention.
Figure 6B:
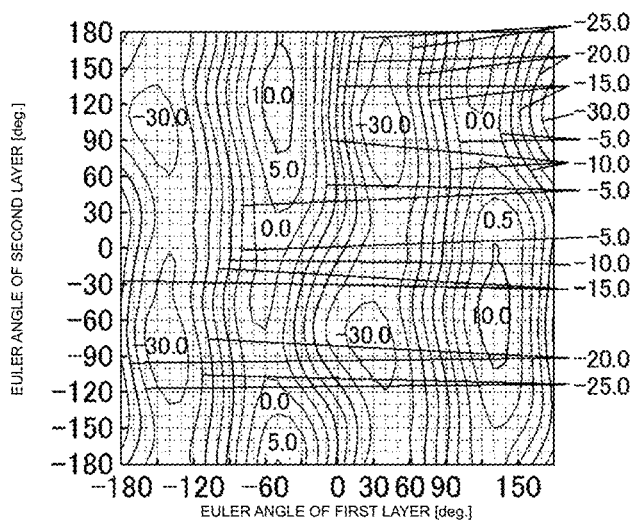
Figure 6C:
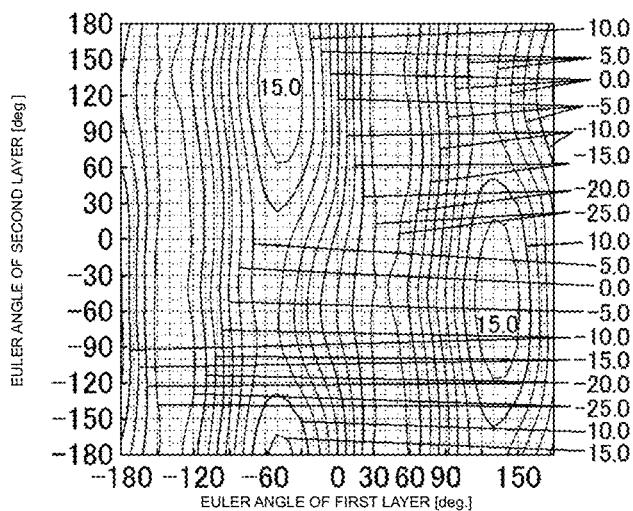

FIGS. 6A to 6C illustrate the TCF characteristic when the ratio (T1/T2), which is the ratio of the thickness T1 of the first piezoelectric layer 3A to the thickness T2 of the second piezoelectric layer 3B, is varied. In each of FIGS. 6A to 6C, the "Euler angle of first layer" is the second Euler angle θ1 in the Euler angles (0, θ1, 0) of the first piezoelectric layer 3A, and the "Euler angle of second layer" is the second Euler angle θ2 in the Euler angles (0, θ2, 0) of the second piezoelectric layer 3B. Conditions to achieve the TCF characteristic of FIGS. 6A to 6C for the acoustic wave device 1 are as follows. The thickness of the IDT electrode 6 is about 0.05λ, the thickness of the low acoustic velocity film 4 is about 0.15λ, and the thickness of the high acoustic velocity film 5 is about 0.15λ. The material of the IDT electrode 6 is aluminum, the material of the low acoustic velocity film 4 is silicon oxide, the material of the high acoustic velocity film 5 is silicon nitride, and the material of the support substrate 2 is silicon.

FIG. 6A illustrates the TCF characteristic when the ratio (T1/T2) is about 0.33. For example, the thickness T1 of the first piezoelectric layer 3A is about 0.05λ, and the thickness T2 of the second piezoelectric layer 3B is about 0.15λ. By selecting a combination of the second Euler angles θ1 and θ2 such that the TCF falls within a range of about −20 ppm/° C. or more and about 20 ppm/° C. or less, preferable characteristics may be achieved. It is more preferable to select a combination of the second Euler angles θ1 and θ2 such that the TCF falls within a range of about −10 ppm/° C. or more and about 10 ppm/° C. or less. With this, more preferable characteristics may be achieved.

FIG. 6B illustrates the TCF characteristic when the ratio (T1/T2) is about 1. For example, the thickness T1 of the first piezoelectric layer 3A and the thickness T2 of the second piezoelectric layer 3B are both about 0.10λ. As in the case that the ratio (T1/T2) is about 0.33, by selecting a combination of the second Euler angles θ1 and θ2 such that the TCF falls within a range of about −20 ppm/° C. or more and about 20 ppm/° C. or less, preferable characteristics may be achieved. It is more preferable to select a combination of the second Euler angles θ1 and θ2 such that the TCF falls within a range of about −10 ppm/° C. or more and about 10 ppm/° C. or less. With this, more preferable characteristics may be achieved.

FIG. 6C illustrates the TCF characteristic when the ratio (T1/T2) is about 3. For example, the thickness T1 of the first piezoelectric layer 3A is about 0.15λ, and the thickness T2 of the second piezoelectric layer 3B is about 0.05λ. As in the case that the ratio (T1/T2) is about 0.33, by selecting a combination of the second Euler angles θ1 and θ2 such that the TCF falls within a range of about −20 ppm/° C. or more and about 20 ppm/° C. or less, preferable characteristics may be achieved. It is more preferable to select a combination of the second Euler angles θ1 and θ2 such that the TCF falls within a range of about −10 ppm/° C. or more and about 10 ppm/° C. or less. With this, more preferable characteristics may be achieved.

(3) Advantageous Effects

In the acoustic wave device 1 according to Preferred Embodiment 3, the absolute value of the TCF is in a range of about 20 ppm/° C. or less. With this, a preferable TCF may be achieved.

In the acoustic wave device 1 according to Preferred Embodiment 3, the absolute value of the TCF is in a range of about 10 ppm/° C. or less. With this, a more preferable TCF may be achieved.

Preferred Embodiment 4

Figure 7:
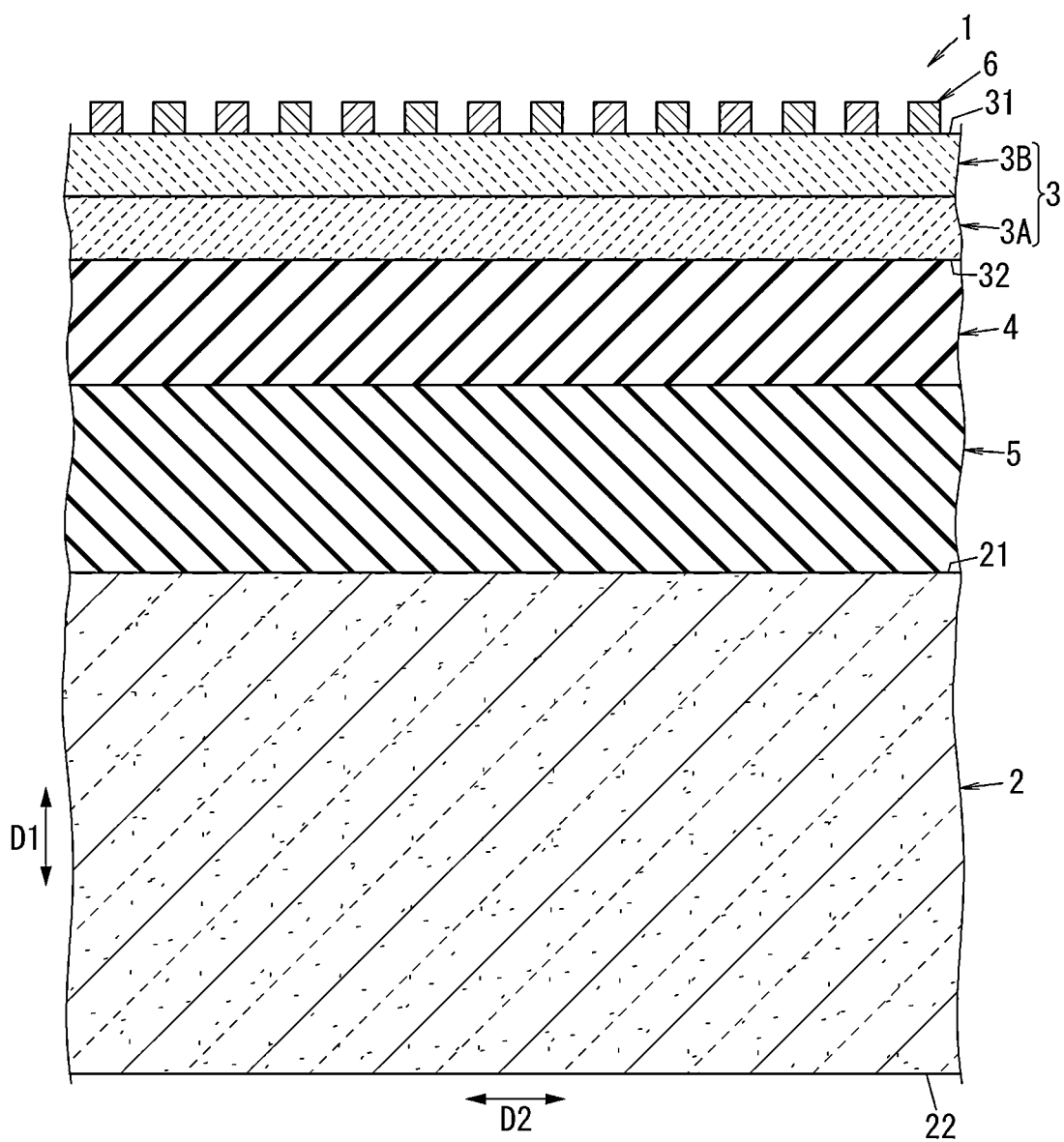
FIG. 7 is a sectional view of an acoustic wave device according to Preferred Embodiment 4 of the present invention.

The acoustic wave device 1 according to Preferred Embodiment 4 of the present invention is different from the acoustic wave device 1 according to Preferred Embodiment 1 (see FIG. 2) in that the first piezoelectric layer 3A and the second piezoelectric layer 3B are swapped as illustrated in FIG. 7. With regard to the acoustic wave device 1 according to Preferred Embodiment 4, the same or corresponding elements as those of the acoustic wave device 1 according to Preferred Embodiment 1 are denoted by the same reference signs, and the description thereof will be omitted.

(1) Configuration

In the acoustic wave device 1 according to Preferred Embodiment 4, the first piezoelectric layer 3A and the second piezoelectric layer 3B are swapped as illustrated in FIG. 7. The acoustic wave device 1 according to Preferred Embodiment 4 includes, the same as or similar to the acoustic wave device 1 according to Preferred Embodiment 1, the support substrate 2, the first piezoelectric layer 3A, the second piezoelectric layer 3B, the low acoustic velocity film 4, the high acoustic velocity film 5, the IDT electrode 6, the two reflectors 7, and the wiring portion 8.

(2) Characteristics of Acoustic Wave Device

Hereinafter, characteristics of the acoustic wave device 1 according to Preferred Embodiment 4 will be described in comparison with the acoustic wave devices of Comparative Example 1 and Comparative Example 2 with reference to the drawings.

FIGS. 8A to 8C illustrate a phase characteristic B1 of the acoustic wave device 1 according to Preferred Embodiment 4, a phase characteristic B2 of the acoustic wave device of Comparative Example 1, and a phase characteristic B3 of the acoustic wave device of Comparative Example 2. FIG. 8B is an enlarged view of the low frequency band (Rayleigh spurious response) in FIGS. 8A and 8C is an enlarged view of the main mode in FIG. 8A.

In the acoustic wave device 1 according to Preferred Embodiment 4, for example, the first piezoelectric layer 3A is a lithium tantalate piezoelectric layer, and the second piezoelectric layer 3B is a lithium niobate piezoelectric layer. The acoustic wave device of Comparative Example 1 is an acoustic wave device of which piezoelectric layer is only a lithium tantalate piezoelectric layer. The acoustic wave device of Comparative Example 2 is an acoustic wave device of which piezoelectric layer is only a lithium niobate piezoelectric layer. The Euler angles of the first piezoelectric layer 3A are denoted as (0, θ1, 0), and the Euler angles of the second piezoelectric layer 3B are denoted as (0, θ2, 0). Then the phase characteristic B1 in FIGS. 8A to 8C is the phase characteristic in a case that the second Euler angle θ1 is about 130° and the second Euler angle θ2 is about 50° in the acoustic wave device 1 according to Preferred Embodiment 4. The phase characteristic B2 is the phase characteristic of the acoustic wave device of Comparative Example 1 in a case that the second Euler angle θ1 is about 130°. The phase characteristic B3 is the phase characteristic of the acoustic wave device of Comparative Example 2 in a case that the second Euler angle θ2 is about 50°.

As illustrated in FIG. 8A, the phase characteristic B1 of the acoustic wave device 1 according to Preferred Embodiment 4 is improved in a frequency band excluding the frequency band of the main mode, compared with the phase characteristic B2 of the acoustic wave device of Comparative Example 1 and the phase characteristic B3 of the acoustic wave device of Comparative Example 2.

In particular, as illustrated in FIG. 8B, the acoustic wave device 1 according to Preferred Embodiment 4 may reduce or prevent the Rayleigh mode spurious response in the lower frequency side relative to the frequency band of the main mode, compared with the acoustic wave devices of Comparative Example 1 and Comparative Example 2. Whereas, as illustrated in FIG. 8C, also in the acoustic wave device 1 according to Preferred Embodiment 4, the characteristics of the main mode are achieved to the same or substantially the same extent as those of the acoustic wave devices of Comparative Example 1 and Comparative Example 2.

Conditions to achieve the phase characteristic B1 in FIGS. 8A to 8C for the acoustic wave device 1 are as follows. The thickness of the IDT electrode 6 is about 0.05λ, the thickness of the first piezoelectric layer 3A is about 0.05λ, the thickness of the second piezoelectric layer 3B is about 0.15λ, the thickness of the low acoustic velocity film 4 is about 0.15λ, and the thickness of the high acoustic velocity film 5 is about 0.15λ. The material of the IDT electrode 6 is aluminum, the material of the low acoustic velocity film 4 is silicon oxide, the material of the high acoustic velocity film 5 is silicon nitride, and the material of the support substrate 2 is silicon. In the acoustic wave device of Comparative Example 1, the thickness of the IDT electrode is about 0.05λ, the thickness of the first piezoelectric layer is about 0.2λ, the thickness of the low acoustic velocity film is about 0.15λ, and the thickness of the high acoustic velocity film is about 0.15λ. The material of the IDT electrode is aluminum, the material of the low acoustic velocity film is silicon oxide, the material of the high acoustic velocity film is silicon nitride, and the material of the support substrate is silicon. In the acoustic wave device of Comparative Example 2, the thickness of the IDT electrode is about 0.05λ, the thickness of the second piezoelectric layer is about 0.2λ, the thickness of the low acoustic velocity film is about 0.15λ, and the thickness of the high acoustic velocity film is about 0.15λ. The material of the IDT electrode is aluminum, the material of the low acoustic velocity film is silicon oxide, the material of the high acoustic velocity film is silicon nitride, and the material of the support substrate is silicon.

(3) Advantageous Effects

In the acoustic wave device 1 according to Preferred Embodiment 4, the first piezoelectric layer 3A (lithium tantalate piezoelectric layer) is laminated on the side of the support substrate 2, and the second piezoelectric layer 3B (lithium niobate piezoelectric layer) is laminated on the side of the IDT electrode 6. With this, a fractional bandwidth is easily increased compared with the case that only the first piezoelectric layer or the second piezoelectric layer is present.

Preferred Embodiment 5

The acoustic wave device 1 according to Preferred Embodiment 5 of the present invention is different from the acoustic wave device 1 according to Preferred Embodiment 4 in that the electromechanical coupling coefficient is, for example, about 4.0% or more, when the first piezoelectric layer 3A is on the side of the support substrate 2 and the second piezoelectric layer 3B is on the side of the IDT electrode 6. With regard to the acoustic wave device 1 according to Preferred Embodiment 5, the same or corresponding elements as those of the acoustic wave device 1 according to Preferred Embodiment 4 are denoted by the same reference signs, and the description thereof will be omitted.

(1) Configuration

In the acoustic wave device 1 according to Preferred Embodiment 5, the Euler angles of the first piezoelectric layer 3A and the Euler angles of the second piezoelectric layer 3B are set such that the electromechanical coupling coefficient is, for example, about 4.0% or more. In a case that the second Euler angle $\theta1$ of the first piezoelectric layer 3A is about 0° or more and about 180° or less, and the second Euler angle $\theta2$ of the second piezoelectric layer 3B is about 0° or more and less than about 180°; the electro-mechanical coupling coefficient is represented as the following Expression (3). In a case that the second Euler angle $\theta1$ of the first piezoelectric layer 3A is about 0° or more and about 180° or less, and the second Euler angle $\theta2$ of the second piezoelectric layer 3B is about −180° or more and less than about 0°; the electromechanical coupling coefficient is represented as the following Expression (4). Expression (3) and Expression (4) are expressions in which the electromechanical coupling coefficient is multiplied by 100. The second Euler angle $\theta1$ satisfies $\theta1=\theta1+180°\times n$ (n=0, ±1, ±2). Note that, with regard to the first piezoelectric layer 3A and the second piezoelectric layer 3B of Preferred Embodiment 5, the description of the same configuration and function as those of the first piezoelectric layer 3A and the second piezoelectric layer 3B of Preferred Embodiment 4 will be omitted.

$$7.62559513565327 + \\ 1.47364312261585 \times \left(\frac{T1}{T2} - 1.44444444433333\right) + \\ 0.147139222406418 \times (\theta1 - 90) + \\ 0.027293067872581 \times (\theta2 - 90) + \\ (-0.00269948950340448) \times \{(\theta1 - 90) \times (\theta1 - 90) - 3000\} + \\ (-0.0000172509717474722) \times \\ \{(\theta1 - 90) \times (\theta1 - 90) \times (\theta1 - 90) - 0\} + \\ 0.0000001945355412511 \times \\ \{(\theta1 - 90) \times (\theta1 - 90) \times (\theta1 - 90) \times (\theta1 - 90) - 16140000\} + \\ (-0.00051780690800265) \times \{(\theta2 - 90) \times (\theta2 - 90) - 3000\} + \\ 0.0122489432338179 \times \left(\frac{T1}{T2} - 1.44444444433333\right) \times \\ (\theta1 - 90) + 0.000227381506027635 \times (\theta1 - 90) \times (\theta2 - 90)$$

Expression (3)

$$4.15314165128706 + \\ 2.21046180005218 \times \left(\frac{T1}{T2} - 1.44444444433333\right) + \\ 0.0957589147129938 \times (\theta1 - 90) + \\ (-0.0148603685972844) \times (\theta2 - (-90)) + \\ (-0.00124406678097088) \times \{(\theta1 - 90) \times (\theta1 - 90) - 3000\} + \\ (-0.0000143982239697196) \times \\ \{(\theta1 - 90) \times (\theta1 - 90) \times (\theta1 - 90) - 0\} + \\ 0.0000001129052061548 \times \\ \{(\theta1 - 90) \times (\theta1 - 90) \times (\theta1 - 90) \times (\theta1 - 90) - 16140000\} + \\ 0.0002323599506035042 \times \\ \{(\theta2 - (-90)) \times (\theta2 - (-90)) - 3000\} + \\ 0.0218577462805003 \times \\ \left(\frac{T1}{T2} - 1.44444444433333\right) \times (\theta1 - 90) + \\ (-0.00023453790132842) \times (\theta1 - 90) \times (\theta2 - (-90))$$

Expression (4)

(2) Characteristics of Acoustic Wave Device

Figure 9A:
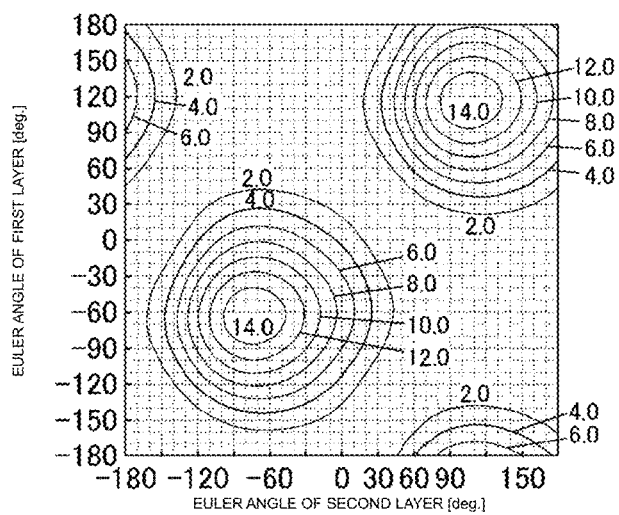
FIGS. 9A to 9C are contour maps illustrating an electromechanical coupling coefficient characteristic in an acoustic wave device according to Preferred Embodiment 5 of the present invention.
Figure 9B:
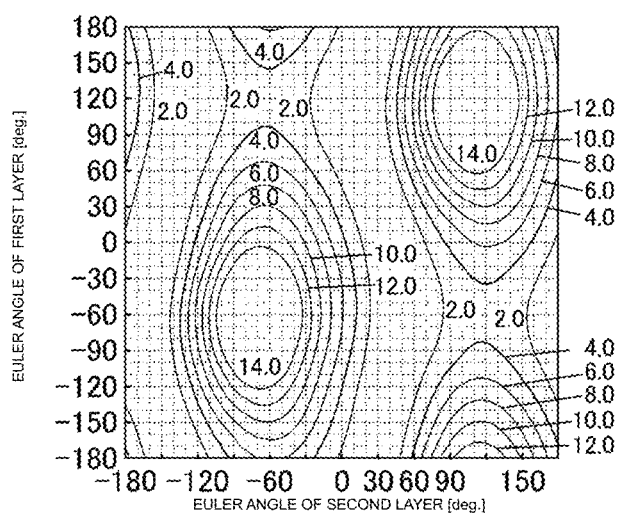
Figure 9C:
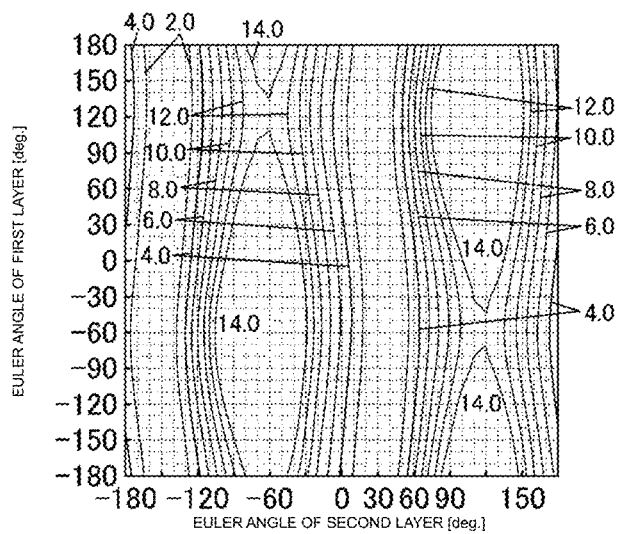

FIGS. 9A to 9C illustrate the electromechanical coupling coefficient characteristic when the ratio (T2/T1), which is the ratio of the thickness T2 of the second piezoelectric layer 3B to the thickness T1 of the first piezoelectric layer 3A, is varied. In each of FIGS. 9A to 9C, the "Euler angle of first layer" is the second Euler angle θ1 in the Euler angles (0, θ1, 0) of the first piezoelectric layer 3A, and the "Euler angle of second layer" is the second Euler angle θ2 in the Euler angles (0, θ2, 0) of the second piezoelectric layer 3B. Conditions to achieve the electromechanical coupling coefficient characteristic in FIGS. 9A to 9C for the acoustic wave device 1 are as follows. The thickness of the IDT electrode 6 is about 0.05λ, the thickness of the low acoustic velocity film 4 is about 0.15λ, and the thickness of the high acoustic velocity film 5 is about 0.15λ. The material of the IDT electrode 6 is aluminum, the material of the low acoustic velocity film 4 is silicon oxide, the material of the high acoustic velocity film 5 is silicon nitride, and the material of the support substrate 2 is silicon.

FIG. 9A illustrates the electromechanical coupling coefficient characteristic when the ratio (T2/T1) is about 0.33. For example, the thickness T1 of the first piezoelectric layer 3A is about 0.15λ, and the thickness T2 of the second piezoelectric layer 3B is about 0.05λ. By selecting a combination of the second Euler angles θ1 and θ2 such that the electromechanical coupling coefficient is about 4.0% or more, preferable characteristics may be achieved.

FIG. 9B illustrates the electromechanical coupling coefficient characteristic when the ratio (T2/T1) is about 1. For example, the thickness T1 of the first piezoelectric layer 3A and the thickness T2 of the second piezoelectric layer 3B are both about 0.10λ. As in the case that the ratio (T2/T1) is about 0.33, by selecting a combination of the second Euler angles θ1 and θ2 such that the electromechanical coupling coefficient is about 4.0% or more, preferable characteristics may be achieved.

FIG. 9C illustrates the electromechanical coupling coefficient characteristic when the ratio (T2/T1) is about 3. For example, the thickness T1 of the first piezoelectric layer 3A is about 0.05λ, and the thickness T2 of the second piezoelectric layer 3B is about 0.15λ. As in the case that the ratio (T2/T1) is about 0.33, by selecting a combination of the second Euler angles θ1 and θ2 such that the electromechanical coupling coefficient is about 4.0% or more, preferable characteristics may be achieved.

(3) Advantageous Effects

The acoustic wave device 1 according to Preferred Embodiment 5 has the electromechanical coupling coefficient of about 4.0% or more. With this, the main mode having an SH wave as the main component may efficiently be excited, and thus preferable characteristics may be achieved. Note that, as described above, Expression (3) and Expression (4) exhibit expressions having calculated the electromechanical coupling coefficient in percentage. For this reason, the second Euler angle θ1 and the second Euler angle θ2 are values such that the electromechanical coupling coefficients represented as Expression (3) and Expression (4) are about 4.0% or more.

Preferred Embodiment 6

The acoustic wave device 1 according to Preferred Embodiment 6 of the present invention is different from the acoustic wave device 1 according to Preferred Embodiment 4 in that the absolute value of the TCF is, for example, about 20 ppm/° C. or less, when the first piezoelectric layer 3A is on the side of the support substrate 2 and the second piezoelectric layer 3B is on the side of the IDT electrode 6.

With regard to the acoustic wave device 1 according to Preferred Embodiment 6, the same or corresponding elements as those of the acoustic wave device 1 according to Preferred Embodiment 4 are denoted by the same reference signs, and the description thereof will be omitted.

(1) Configuration

In the acoustic wave device 1 according to Preferred Embodiment 6, the Euler angles of the first piezoelectric layer 3A and the Euler angles of the second piezoelectric layer 3B are set such that the absolute value of the TCF is, for example, about 20 ppm/° C. or less. In a case that the second Euler angle θ1 of the first piezoelectric layer 3A is about 0° or more and about 180° or less, and the second Euler angle θ2 of the second piezoelectric layer 3B is about 0° or more and less than about 180°; the TCF is represented as the following Expression (7). In a case that the second Euler angle θ1 of the first piezoelectric layer 3A is about 0° or more and about 180° or less, and the second Euler angle θ2 of the second piezoelectric layer 3B is about −180° or more and less than about 0°; the TCF is represented as the following Expression (8). With regard to the first piezoelectric layer 3A and the second piezoelectric layer 3B of Preferred Embodiment 6, the description of the same configuration and function as those of the first piezoelectric layer 3A and the second piezoelectric layer 3B of Preferred Embodiment 4 will be omitted.

$$\begin{aligned}
&7.62559513565327 + \\
&\quad 1.47364312261585 \times \left(\frac{T1}{T2} - 1.44444444433333\right) + \\
&\quad 0.147139222406418 \times (\theta 1 - 90) + \\
&\quad 0.027293067872581 \times (\theta 2 - 90) + \\
&\quad (-0.00269948980340448) \times \{(\theta 1 - 90) \times (\theta 1 - 90) - 3000\} + \\
&\quad (-0.0000172509717474722) \times \\
&\quad \{(\theta 1 - 90) \times (\theta 1 - 90) \times (\theta 1 - 90) - 0\} + \\
&\quad 0.0000001945355412511 \times \\
&\quad \{(\theta 1 - 90) \times (\theta 1 - 90) \times (\theta 1 - 90) \times (\theta 1 - 90) - 16140000\} + \\
&\quad (-0.00051780690800265) \times \{(\theta 2 - 90) \times (\theta 2 - 90) - 3000\} + \\
&\quad 0.0122489432338179 \times \left(\frac{T1}{T2} - 1.44444444433333\right) \times \\
&\quad (\theta 1 - 90) + 0.000227381506027635 \times (\theta 1 - 90) \times (\theta 2 - 90)
\end{aligned}$$

Expression (7)

$$\begin{aligned}
&4.15314165128706 + \\
&\quad 2.21046180005218 \times \left(\frac{T1}{T2} - 1.44444444433333\right) + \\
&\quad 0.0957589147129938 \times (\theta 1 - 90) + \\
&\quad (-0.0148603685972844) \times (\theta 2 - (-90)) + \\
&\quad (-0.00124406678097088) \times \{(\theta 1 - 90) \times (\theta 1 - 90) - 3000\} + \\
&\quad (-0.0000143982239697196) \times \\
&\quad \{(\theta 1 - 90) \times (\theta 1 - 90) \times (\theta 1 - 90) - 0\} + \\
&\quad 0.0000001129052061548 \times \\
&\quad \{(\theta 1 - 90) \times (\theta 1 - 90) \times (\theta 1 - 90) \times (\theta 1 - 90) - 16140000\} + \\
&\quad 0.000232359950603504 \times
\end{aligned}$$

Expression (8)

-continued $$\{(\theta2 - (-90)) \times (\theta2 - (-90)) - 3000\} +$$

$$0.0218577462805003 \times$$

$$\left(\frac{T1}{T2} - 1.44444444433333\right) \times (\theta1 - 90) +$$

$$(-0.00023453790132842) \times (\theta1 - 90) \times (\theta2 - (-90))$$

(2) Characteristics of Acoustic Wave Device

Figure 10A:
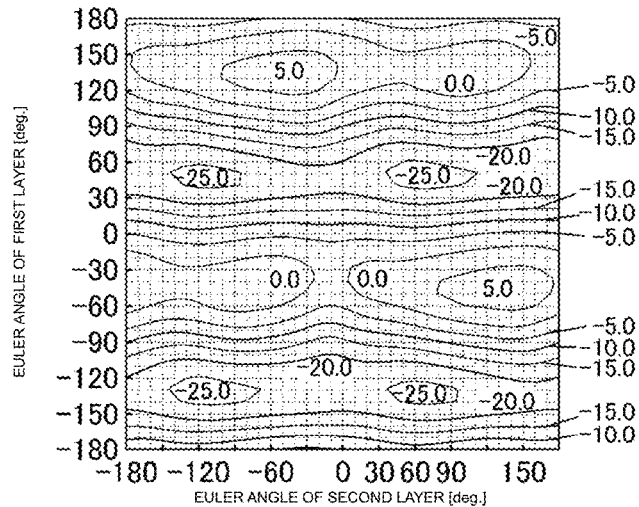
FIGS. 10A to 10C are contour maps illustrating a TCF characteristic in an acoustic wave device according to Preferred Embodiment 6 of the present invention.
Figure 10B:
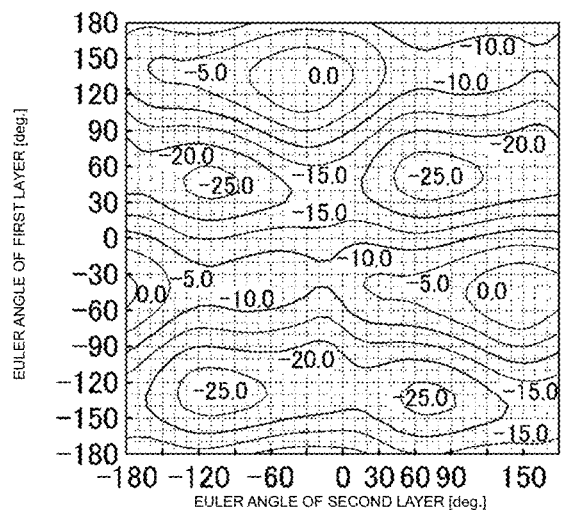
Figure 10C:
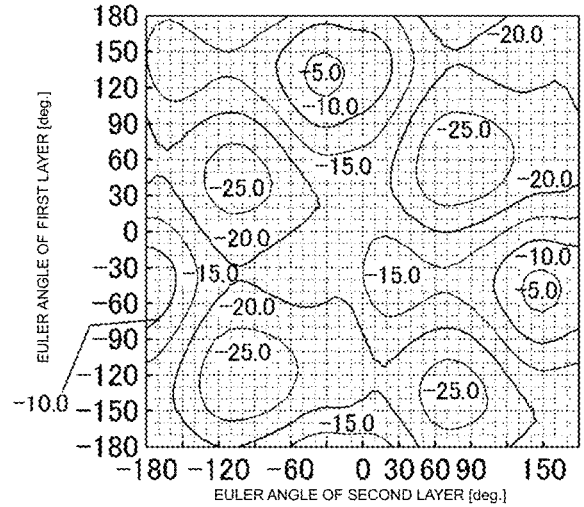

FIGS. 10A to 10C illustrate the TCF characteristic when the ratio (T2/T1), which is the ratio of the thickness T2 of the second piezoelectric layer 3B to the thickness T1 of the first piezoelectric layer 3A, is varied. In each of FIGS. 10A to 10C, the "Euler angle of first layer" is the second Euler angle θ1 in the Euler angles (0, θ1, 0) of the first piezoelectric layer 3A, and the "Euler angle of second layer" is the second Euler angle θ2 in the Euler angles (0, θ2, 0) of the second piezoelectric layer 3B. Conditions to achieve the TCF characteristic of FIGS. 10A to 10C for the acoustic wave device 1 are as follows. The thickness of the IDT electrode 6 is about 0.05λ, the thickness of the low acoustic velocity film 4 is about 0.15λ, and the thickness of the high acoustic velocity film 5 is about 0.15λ. The material of the IDT electrode 6 is aluminum, the material of the low acoustic velocity film 4 is silicon oxide, the material of the high acoustic velocity film 5 is silicon nitride, and the material of the support substrate 2 is silicon.

FIG. 10A illustrates the TCF characteristic when the ratio (T2/T1) is about 0.33. For example, the thickness T1 of the first piezoelectric layer 3A is about 0.15λ, and the thickness T2 of the second piezoelectric layer 3B is about 0.05λ. By selecting a combination of the second Euler angles θ1 and θ2 such that the TCF falls within a range of about −20 ppm/° C. or more and about 20 ppm/° C. or less, preferable characteristics may be achieved. It is more preferable to select a combination of the second Euler angles θ1 and θ2 such that the TCF falls within a range of about −10 ppm/° C. or more and about 10 ppm/° C. or less. With this, more preferable characteristics may be achieved.

FIG. 10B illustrates the TCF characteristic when the ratio (T2/T1) is about 1. For example, the thickness T1 of the first piezoelectric layer 3A and the thickness T2 of the second piezoelectric layer 3B are both about 0.10λ. As in the case that the ratio (T2/T1) is about 0.33, by selecting a combination of the second Euler angles θ1 and θ2 such that the TCF falls within a range of about −20 ppm/° C. or more and about 20 ppm/° C. or less, preferable characteristics may be achieved. It is more preferable to select a combination of the second Euler angles θ1 and θ2 such that the TCF falls within a range of about −10 ppm/° C. or more and about 10 ppm/° C. or less. With this, more preferable characteristics may be achieved.

FIG. 10C illustrates the TCF characteristic when the ratio (T2/T1) is about 3. For example, the thickness T1 of the first piezoelectric layer 3A is about 0.05λ, and the thickness T2 of the second piezoelectric layer 3B is about 0.15λ. As in the case that the ratio (T2/T1) is about 0.33, by selecting a combination of the second Euler angles θ1 and θ2 such that the TCF falls within a range of about −20 ppm/° C. or more and about 20 ppm/° C. or less, preferable characteristics may be achieved. It is more preferable to select a combination of the second Euler angles θ1 and θ2 such that the TCF falls within a range of about −10 ppm/° C. or more and about 10 ppm/° C. or less. With this, more preferable characteristics may be achieved.

(3) Advantageous Effects

In the acoustic wave device 1 according to Preferred Embodiment 6, the absolute value of the TCF is in a range of about 20 ppm/° C. or less. With this, a preferable TCF may be achieved.

In the acoustic wave device 1 according to Preferred Embodiment 6, the absolute value of the TCF is in a range of about 10 ppm/° C. or less. With this, a more preferable TCF may be achieved.

Preferred Embodiment 7

Figure 11:
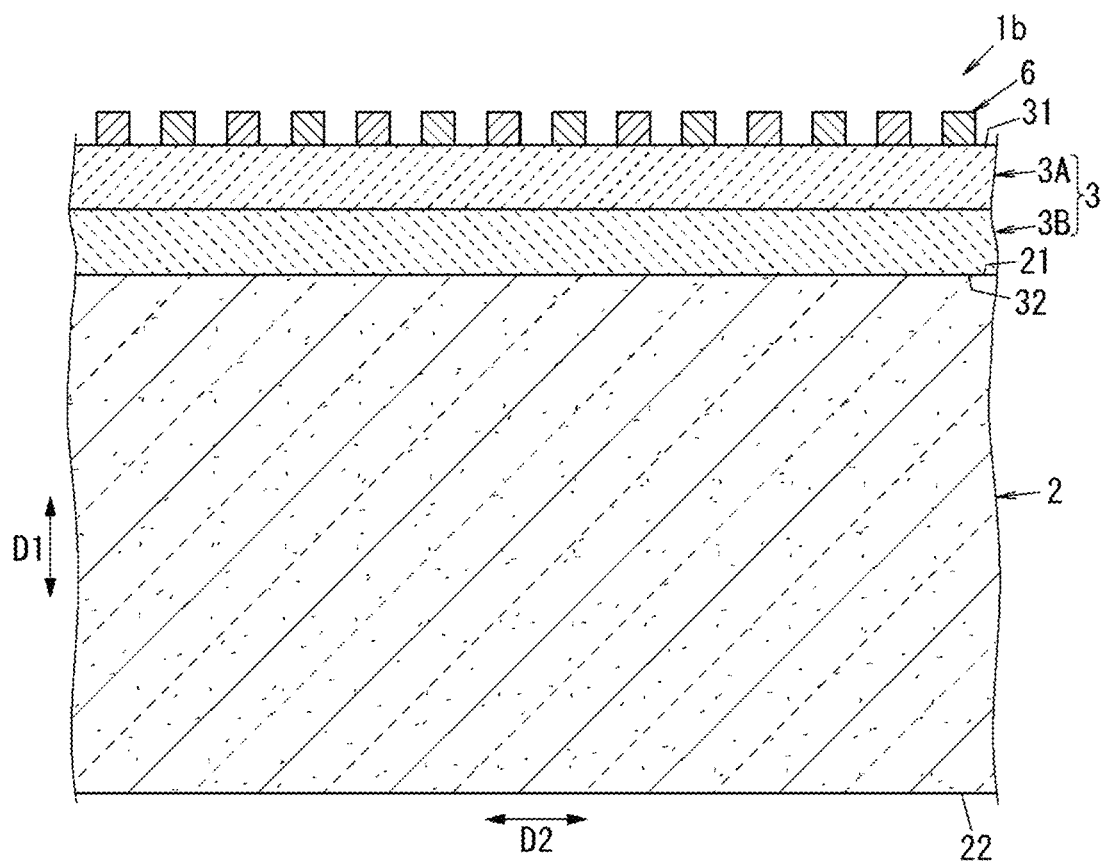
FIG. 11 is a sectional view of an acoustic wave device according to Preferred Embodiment 7 of the present invention.

An acoustic wave device 1b according to Preferred Embodiment 7 of the present invention is different from the acoustic wave device 1 according to Preferred Embodiment 1 (see FIG. 2) in that the second piezoelectric layer 3B is directly provided on the support substrate 2 as illustrated in FIG. 11. With regard to the acoustic wave device 1b according to Preferred Embodiment 7, the same or corresponding elements as those of the acoustic wave device 1 according to Preferred Embodiment 1 are denoted by the same reference signs, and the description thereof will be omitted.

(1) Configuration

In the acoustic wave device 1b according to Preferred Embodiment 7, the second piezoelectric layer 3B is directly provided on the support substrate 2 as illustrated in FIG. 11. That is, the acoustic wave device 1b includes no low acoustic velocity film 4 and no high acoustic velocity film 5. Whereas, the acoustic wave device 1b includes the support substrate 2, the first piezoelectric layer 3A, the second piezoelectric layer 3B, and the IDT electrode 6, as same as the acoustic wave device 1 according to Preferred Embodiment 1.

(2) Characteristics of Acoustic Wave Device

Also in the acoustic wave device 1b according to Preferred Embodiment 7, as same as the acoustic wave device 1 according to Preferred Embodiment 1, when the total film thickness of the first piezoelectric layer 3A and the second piezoelectric layer 3B is 0.66λ or less, the phase characteristic of the higher-order mode is small.

(3) Advantageous Effects

Also in the acoustic wave device 1b according to Preferred Embodiment 7, the same as or similar to the acoustic wave device 1 according to Preferred Embodiment 1, an acoustic wave device capable of reducing or preventing a Rayleigh mode spurious response generated in a band of a lower frequency side relative to an excitation mode used to achieve the characteristics, and a higher-order mode spurious response generated in a band of a higher frequency side relative to the excitation mode is provided. Further, when the acoustic wave device 1b is used as a filter, it is possible to reduce or prevent a Rayleigh mode spurious response generated in a lower frequency band side relative to the pass band of the filter, and to reduce a higher-order mode spurious response generated in a higher frequency band side relative to the pass band of the filter.

Preferred Embodiment 8

Figure 12:
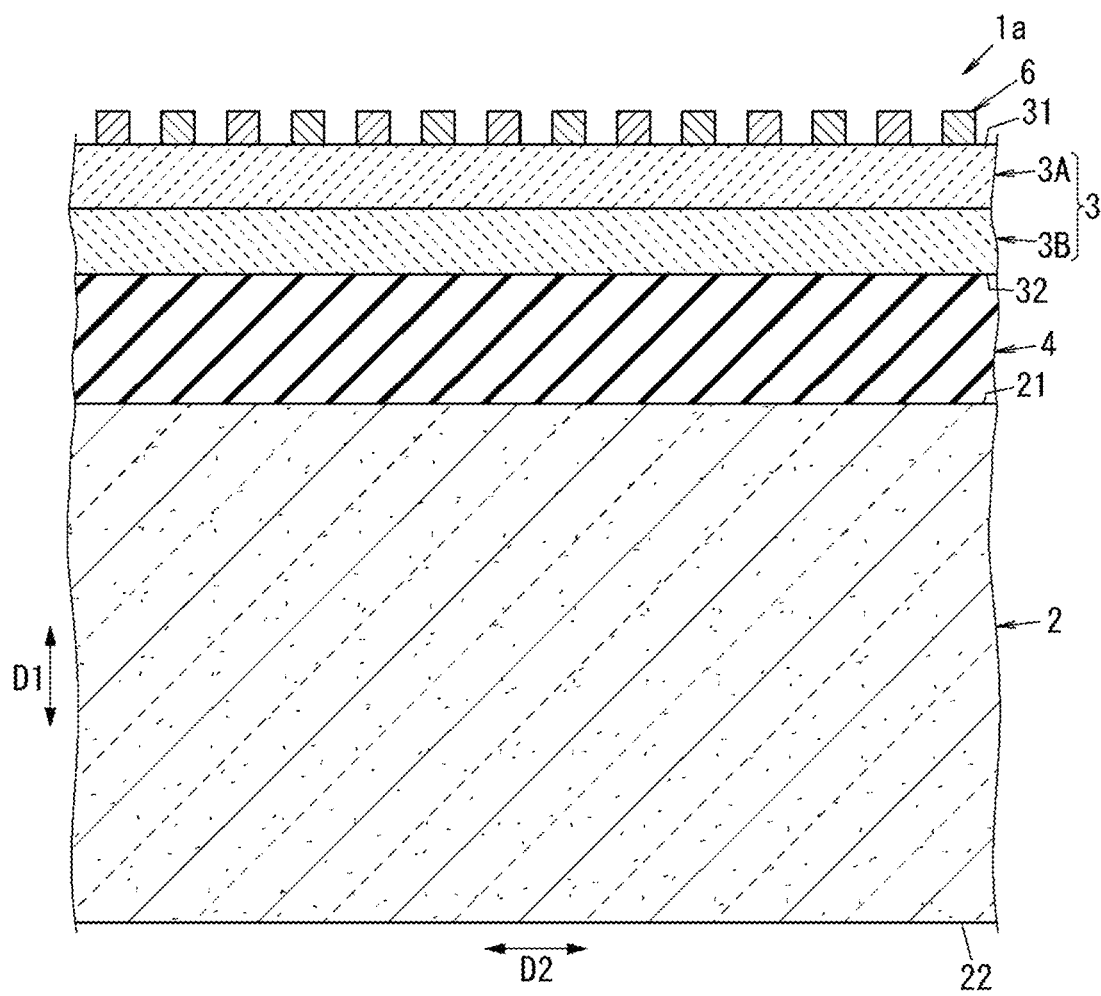
FIG. 12 is a sectional view of an acoustic wave device according to Preferred Embodiment 8 of the present invention.

An acoustic wave device 1a according to Preferred Embodiment 8 of the present invention is different from the acoustic wave device 1 according to Preferred Embodiment 1 (see FIG. 2) in that the high acoustic velocity film 5 is not provided as illustrated in FIG. 12. With regard to the acoustic wave device 1a according to Preferred Embodiment 8, the same or corresponding elements as those of the acoustic wave device 1 according to Preferred Embodiment 1 are denoted by the same reference signs, and the description thereof will be omitted.

(1) Configuration

The acoustic wave device 1a according to Preferred Embodiment 8 does not include the high acoustic velocity film 5 as illustrated in FIG. 12. That is, the low acoustic velocity film 4 is directly provided on the support substrate 2. Whereas, the acoustic wave device 1a includes the support substrate 2, the first piezoelectric layer 3A and the second piezoelectric layer 3B, the low acoustic velocity film 4, and the IDT electrode 6, the same as or similar to the acoustic wave device 1 according to Preferred Embodiment 1.

In the acoustic wave device 1a according to Preferred Embodiment 8, the support substrate 2 is a high acoustic velocity support substrate. The high acoustic velocity support substrate is a support substrate in which an acoustic velocity of a bulk wave propagating through the high acoustic velocity support substrate is higher than an acoustic velocity of an acoustic wave propagating through the first piezoelectric layer 3A and the second piezoelectric layer 3B. With this, the Q factor of the acoustic wave device 1a may further be improved.

(2) Characteristics of Acoustic Wave Device

Also in the acoustic wave device 1a according to Preferred Embodiment 8, as same as the acoustic wave device 1 according to Preferred Embodiment 1, when the total film thickness of the first piezoelectric layer 3A and the second piezoelectric layer 3B is, for example, about 0.66λ or less, the phase characteristic of the higher-order mode is small.

(3) Effects

Also in the acoustic wave device 1a according to Preferred Embodiment 8, the same as or similar to the acoustic wave device 1 according to Preferred Embodiment 1, the low acoustic velocity film 4 is provided between the support substrate 2 and the second piezoelectric layer 3B in the thickness direction (first direction D1) of the support substrate 2. With this, the Q factor of the acoustic wave device 1a may be improved.

In the acoustic wave device 1a according to Preferred Embodiment 8, the support substrate 2 is a high acoustic velocity support substrate. With this, the Q factor of the acoustic wave device 1a may further be improved.

The preferred embodiments and modifications described above are merely some of the various preferred embodiments and modifications of the present invention. Further, variations may be applied to the preferred embodiments and modifications depending on design or the like as long as the object of the invention can be achieved.

For example, a surface of the first piezoelectric layer 3A on a side of the second piezoelectric layer 3B and a surface of the second piezoelectric layer 3B on a side of the first piezoelectric layer 3A may have the same polarity. Specifically, when the surface of the first piezoelectric layer 3A on the side of the IDT electrode 6 is a positive surface and the surface of the first piezoelectric layer 3A on the side of the support substrate 2 is a negative surface, it is allowed that the surface of the second piezoelectric layer 3B on the side of the IDT electrode 6 is a negative surface and the surface of the second piezoelectric layer 3B on the side of the support substrate 2 is a positive surface. Further, when the surface of the first piezoelectric layer 3A on the side of the IDT electrode 6 is a negative surface and the surface of the first piezoelectric layer 3A on the side of the support substrate 2 is a positive surface, it is allowed that the surface of the second piezoelectric layer 3B on the side of the IDT electrode 6 is a positive surface and the surface of the second piezoelectric layer 3B on the side of the support substrate 2 is a negative surface. Even in the case above, when the acoustic wave device 1 is used as a filter, it is possible to reduce a Rayleigh mode spurious response generated in a lower frequency band side relative to the pass band of the filter, and to reduce a higher-order mode spurious response generated in a higher frequency band side relative to the pass band of the filter.

The following aspects of preferred embodiments of the present invention are disclosed in the present description.

An acoustic wave device (1; 1a; 1b; 1c) according to a preferred embodiment of the present invention includes a support substrate (2), a multilayer body (3), and an IDT electrode (6). The multilayer body (3) includes a lithium tantalate piezoelectric layer (first piezoelectric layer 3A) and a lithium niobate piezoelectric layer (second piezoelectric layer 3B) that are laminated, and is provided on the support substrate (2). The IDT electrode (6) is provided on the multilayer body (3), and includes a plurality of electrode fingers (63). When the wavelength of the acoustic wave determined by the pitch (P1) of the plurality of electrode fingers (63) is denoted as λ, the thickness of the multilayer body (3) is about 0.66λ or less.

With the acoustic wave device (1; 1a; 1b; 1c) according to the above-described preferred embodiment, it is possible to reduce or prevent a Rayleigh mode spurious response generated in a band of a lower frequency side relative to an excitation mode used to achieve characteristics, and a higher-order mode spurious response generated in a band of a higher frequency side relative to the excitation mode. Further, when the acoustic wave device (1; 1a; 1b; 1c) is used as a filter, it is possible to reduce or prevent a Rayleigh mode spurious response generated in a lower frequency band side relative to the pass band of the filter, and to reduce a higher-order mode spurious response generated in a higher frequency band side relative to the pass band of the filter.

In an acoustic wave device (1; 1a; 1b; 1c) according to a preferred embodiment of the present invention, the lithium tantalate piezoelectric layer (first piezoelectric layer 3A) is laminated on a side of the IDT electrode (6). The lithium niobate piezoelectric layer (second piezoelectric layer 3B) is laminated on a side of the support substrate (2).

With the acoustic wave device (1; 1a; 1b; 1c) according to the above-described preferred embodiment, temperature characteristics may be improved.

In an acoustic wave device (1; 1a; 1b; 1c) according to a preferred embodiment of the present invention, the lithium tantalate piezoelectric layer (first piezoelectric layer 3A) is laminated on the side of the support substrate (2). The lithium niobate piezoelectric layer (second piezoelectric layer 3B) is laminated on the side of the IDT electrode (6).

With the acoustic wave device (1; 1a; 1b; 1c) according to the above-described preferred embodiment, it is easy to increase the fractional bandwidth as compared with a case that only the lithium tantalate piezoelectric layer or the lithium niobate piezoelectric layer is provided.

In an acoustic wave device (1; 1a; 1b; 1c) according to a preferred embodiment of the present invention, the electromechanical coupling coefficient satisfies Expression (1) under the conditions as follows. The thickness of the lithium tantalate piezoelectric layer (first piezoelectric layer 3A) is denoted as T1, the thickness of the lithium niobate piezoelectric layer (second piezoelectric layer 3B) is denoted as T2, the second Euler angle of the lithium tantalate piezoelectric layer is denoted as θ1, and the second Euler angle of the lithium niobate piezoelectric layer is denoted as θ2; and the second Euler angle θ1 is about 0° or more and about 180° or less, and the second Euler angle θ2 is about 0° or more and less than about 180°. In a case that the second Euler angle θ1 is about 0° or more and about 180° or less, and the second Euler angle θ2 is about −180° or more and less than about 0°; the electromechanical coupling coefficient satisfies Expression (2). The second Euler angle θ1 and the second Euler angle θ2 are values such that the electromechanical coupling coefficient is about 4.0% or more. Expression (1) and Expression (2) are expressions having calculated the electromechanical coupling coefficient in percentage. For this reason, the second Euler angle θ1 and the second Euler angle θ2 are values such that the electromechanical coupling coefficients represented as Expression (1) and Expression (2) are about 4.0% or more. Note that the second Euler angle θ1 satisfies θ1=θ1+180°×n (n=0, ±1, ±2).

Expression (1)
$$6.10489714829633 +$$
$$(-1.33487064946561) \times \left(\frac{T1}{T2} - 1.44444444433333\right) +$$
$$0.0751823042830098 \times (\theta1 - 90) +$$
$$0.083704332683124 \times (\theta2 - 90) +$$
$$0.927428408819691 \times \left\{\left(\frac{T1}{T2} - 1.44444444433333\right) \times\right.$$
$$\left.\left(\frac{T1}{T2} - 1.44444444433333\right) - 1.28395061753088\right\} +$$
$$(-0.00144447241419258) \times \{(\theta1 - 90) \times (\theta1 - 90) - 3000\} +$$
$$(-0.0000077475616075308) \times$$
$$\{(\theta1 - 90) \times (\theta1 - 90) \times (\theta1 - 90) - 0\} +$$
$$0.0000000903853423589 \times$$
$$\{(\theta1 - 90) \times (\theta1 - 90) \times (\theta1 - 90) \times (\theta1 - 90) - 16140000\} +$$
$$(-0.00143615455366066) \times \{(\theta2 - 90) \times (\theta2 - 90) - 3000\} +$$
$$(-0.0000084727694286792) \times$$
$$\{(\theta2 - 90) \times (\theta2 - 90) \times (\theta2 - 90) - 0\} +$$
$$0.0000000922825081781 \times$$
$$\{(\theta2 - 90) \times (\theta2 - 90) \times (\theta2 - 90) \times (\theta2 - 90) - 16140000\} +$$
$$(-0.0136937600766242) \times \left(\frac{T1}{T2} - 1.44444444433333\right) \times$$
$$(\theta2 - 90) + 0.000272045866480268 \times (\theta1 - 90) \times (\theta2 - 90)$$

Expression (2)
$$2.6203567327276 +$$
$$(-0.891540666255983) \times \left(\frac{T1}{T2} - 1.44444444433333\right) +$$
$$0.0251129624812418 \times (\theta1 - 90) +$$
$$0.026901842780151 \times (\theta2 - (-90)) +$$
$$1.29138198424116 \times \left\{\left(\frac{T1}{T2} - 1.44444444433333\right) \times\right.$$
$$\left.\left(\frac{T1}{T2} - 1.44444444433333\right) - 1.28395061753088\right\} +$$
$$0.000030767162653015 \times \{(\theta1 - 90) \times (\theta1 - 90) - 3000\} +$$
$$(-0.0000053634747902267) \times$$
$$\{(\theta1 - 90) \times (\theta1 - 90) \times (\theta1 - 90) - 0\} +$$
$$(-0.000397017013538763) \times$$
$$\{(\theta2 - (-90)) \times (\theta2 - (-90)) - 3000\} +$$
$$(-0.000006110078359279) \times$$
$$\{(\theta2 - (-90)) \times (\theta2 - (-90)) \times (\theta2 - (-90)) - 0\} +$$
$$0.0000000559880444857 \times \{(\theta2 - (-90)) \times (\theta2 - (-90)) \times$$
$$(\theta2 - (-90)) \times (\theta2 - (-90)) - 16140000\} +$$
$$0.0110300006478456 \times \left(\frac{T1}{T2} - 1.44444444433333\right) \times$$
$$(\theta1 - 90) +$$
$$(-0.00503930615559755) \times$$
$$\left(\frac{T1}{T2} - 1.44444444433333\right) \times$$
$$(\theta2 - (-90)) +$$
$$(-0.00025434331383419) \times$$
$$(\theta1 - 90) \times (\theta2 - (-90))$$

With the acoustic wave device (1; 1a; 1b; 1c) according to the above-described preferred embodiment, the main mode having an SH wave as the main component may efficiently be excited, and thus preferable characteristics may be achieved.

In an acoustic wave device (1; 1a; 1b; 1c) according to a preferred embodiment of the present invention, the electromechanical coupling coefficient satisfies Expression (3) under the conditions as follows. The thickness of the lithium tantalate piezoelectric layer (first piezoelectric layer 3A) is denoted as T1, the thickness of the lithium niobate piezoelectric layer (second piezoelectric layer 3B) is denoted as T2, the second Euler angle of the lithium tantalate piezoelectric layer is denoted as θ1, and the second Euler angle of the lithium niobate piezoelectric layer is denoted as θ2; and the second Euler angle θ1 is about 0° or more and about 180° or less, and the second Euler angle θ2 is about 0° or more and less than about 180°. In a case that the second Euler angle θ1 is about 0° or more and about 180° or less, and the second Euler angle θ2 is about −180° or more and less than about 0°; the electromechanical coupling coefficient satisfies Expression (4). The second Euler angle θ1 and the second Euler angle θ2 are values such that the electromechanical coupling coefficient is about 4.0% or more. Expression (3) and Expression (4) are expressions having calculated the electromechanical coupling coefficient in percentage. For this reason, the second Euler angle θ1 and the second Euler angle θ2 are values such that the electromechanical coupling coefficients represented as Expression (3) and Expression (4) are about 4.0% or more. Note that the second Euler angle θ1 satisfies θ1=θ1+180°×n (n=0, ±1, ±2).

$$
\begin{aligned}
& 7.62559513565327 + \\
& \quad 1.4736431226185 \times \left(\frac{T1}{T2} - 1.44444444433333\right) + \\
& \quad 0.147139222406418 \times (\theta1 - 90) + \\
& \quad 0.027293067872581 \times (\theta2 - 90) + \\
& \quad (-0.00269948950340448) \times \{(\theta1 - 90) \times (\theta1 - 90) - 3000\} + \\
& \quad (-0.0000172509717474722) \times \\
& \quad \{(\theta1 - 90) \times (\theta1 - 90) \times (\theta1 - 90) - 0\} + \\
& \quad 0.0000001945355412511 \times \\
& \quad \{(\theta1 - 90) \times (\theta1 - 90) \times (\theta1 - 90) \times (\theta1 - 90) - 16140000\} + \\
& \quad (-0.000517880690800265) \times \\
& \quad \{(\theta2 - 90) \times (\theta2 - 90) - 3000\} + 0.0122489432338179 \times \\
& \quad \left(\frac{T1}{T2} - 1.44444444433333\right) \times (\theta1 - 90) + \\
& \quad 0.000227381506027635 \times (\theta1 - 90) \times (\theta2 - 90)
\end{aligned}
$$
Expression (3)

$$
\begin{aligned}
& 4.15314165128706 + \\
& \quad 2.21046180005218 \times \left(\frac{T1}{T2} - 1.44444444433333\right) + \\
& \quad 0.0957589147129938 \times (\theta1 - 90) + \\
& \quad (-0.0148603685972844) \times (\theta2 - (-90)) + \\
& \quad (-0.00124406678097088) \times \{(\theta1 - 90) \times (\theta1 - 90) - 3000\} + \\
& \quad (-0.0000143982239697196) \times \\
& \quad \{(\theta1 - 90) \times (\theta1 - 90) \times (\theta1 - 90) - 0\} + \\
& \quad 0.0000001129052061548 \times \\
& \quad \{(\theta1 - 90) \times (\theta1 - 90) \times (\theta1 - 90) \times (\theta1 - 90) - 16140000\} + \\
& \quad 0.0002323599506035 04 \times \\
& \quad \{(\theta2 - (-90)) \times (\theta2 - (-90)) - 3000\} + \\
& \quad 0.0218577462805003 \times \\
& \quad \left(\frac{T1}{T2} - 1.44444444433333\right) \times (\theta1 - 90) + \\
& \quad (-0.00023453790132842) \times (\theta1 - 90) \times (\theta2 - (-90))
\end{aligned}
$$
Expression (4)

With the acoustic wave device (1; 1*a*; 1*b*; 1*c*) according to the above-described preferred embodiment, the main mode having an SH wave as the main component may efficiently be excited, and thus preferable characteristics may be achieved.

In an acoustic wave device (1; 1*a*; 1*b*; 1*c*) according to a preferred embodiment of the present invention, the TCF satisfies Expression (5) under the conditions as follows. The thickness of the lithium tantalate piezoelectric layer (first piezoelectric layer 3A) is denoted as T1, the thickness of the LiNbO₃ piezoelectric layer (second piezoelectric layer 3B) is denoted as T2, the second Euler angle of the lithium tantalate piezoelectric layer is denoted as θ1, and the second Euler angle of the lithium niobate piezoelectric layer is denoted as θ2; and the second Euler angle θ1 is about 0° or more and about 180° or less, and the second Euler angle θ2 is about 0° or more and less than about 180°. In a case that the second Euler angle θ1 is about 0° or more and about 180° or less, and the second Euler angle θ2 is about −180° or more and less than about 0°; the TCF satisfies the Expression (6). The second Euler angle θ1 and the second Euler angle θ2 are values such that the absolute value of the TCF falls within a range of about 20 ppm/° C. or less.

$$
\begin{aligned}
& (-14.8326541312623) + \\
& \quad 5.9468925587845 \times \left(\frac{T1}{T2} - 1.44444444433333\right) + \\
& \quad 0.543285669216811 \times (\theta1 - 90) + \\
& \quad (-0.0289565650225207) \times (\theta2 - 90) + \\
& \quad (-2.78596009856013) \times \left\{\left(\frac{T1}{T2} - 1.44444444433333\right) \times \right. \\
& \quad \left. \left(\frac{T1}{T2} - 1.44444444433333\right) - 1.28395061753088\right\} + \\
& \quad (-0.00289637570199324) \times \{(\theta1 - 90) \times (\theta1 - 90) - 3000\} + \\
& \quad (-0.000117601847921907) \times \\
& \quad \{(\theta1 - 90) \times (\theta1 - 90) \times (\theta1 - 90) - 0\} + \\
& \quad 0.0000002606431101102 \times \\
& \quad \{(\theta1 - 90) \times (\theta1 - 90) \times (\theta1 - 90) \times (\theta1 - 90) - 16140000\} + \\
& \quad 0.00000000058278132228 \times \{(\theta1 - 90) \times \\
& \quad (\theta1 - 90) \times (\theta1 - 90) \times (\theta1 - 90) - 0\} + \\
& \quad 0.000720583879743022 \times \{(\theta2 - 90) \times (\theta2 - 90) - 3000\} + \\
& \quad (-0.000456726259950784) \times (\theta1 - 90) \times (\theta2 - 90)
\end{aligned}
$$
Expression (5)

$$
\begin{aligned}
& 2.6203567327276 + \\
& \quad (-0.891540666255983) \times \left(\frac{T1}{T2} - 1.44444444433333\right) + \\
& \quad 0.0251129624812418 \times (\theta1 - 90) + \\
& \quad 1.29138198424116 \times \left\{\left(\frac{T1}{T2} - 1.44444444433333\right) \times \right. \\
& \quad \left. \left(\frac{T1}{T2} - 1.44444444433333\right) - 1.28395061753088\right\} + \\
& \quad 0.000030767162653015 \times \{(\theta1 - 90) \times (\theta1 - 90) - 3000\} + \\
& \quad (-0.0000053634747902267) \times \\
& \quad \{(\theta1 - 90) \times (\theta1 - 90) \times (\theta1 - 90) - 0\} + \\
& \quad 0.0110300006478456 \times \\
& \quad \left(\frac{T1}{T2} - 1.44444444433333\right) \times (\theta1 - 90)
\end{aligned}
$$
Expression (6)

With the acoustic wave device (1; 1*a*; 1*b*; 1*c*) according to the above-described preferred embodiment, a preferable TCF may be achieved.

In an acoustic wave device (1; 1*a*; 1*b*; 1*c*) according to a preferred embodiment of the present invention, the second Euler angle θ1 and the second Euler angle θ2 are values such that the absolute value of the TCF falls within a range of about 10 ppm/° C. or less.

With the acoustic wave device (1; 1*a*; 1*b*; 1*c*) according to the above-described preferred embodiment, a more preferable TCF may be achieved.

In an acoustic wave device (1; 1*a*; 1*b*; 1*c*) according to a preferred embodiment of the present invention, the TCF satisfies Expression (7) under the conditions as follows. In the third aspect, the thickness of the lithium tantalate piezoelectric layer (first piezoelectric layer 3A) is denoted as T1, the thickness of the lithium niobate piezoelectric layer (second piezoelectric layer 3B) is denoted as T2, the second Euler angle of the lithium tantalate piezoelectric layer is denoted as θ1, and the second Euler angle of the lithium niobate piezoelectric layer is denoted as θ2; and the second Euler angle θ1 is about 0° or more and about 180° or less, and the second Euler angle θ2 is about 0° or more and less than about 180°. In a case that the second Euler angle θ1 is about 0° or more and about 180° or less, and the second Euler angle θ2 is about −180° or more and less than about 0°; the TCF satisfies the Expression (8). The second Euler angle θ1 and the second Euler angle θ2 are values such that the absolute value of the TCF falls within a range of about 20 ppm/° C. or less.

$$7.62559513565327 + \qquad \text{Expression (7)}$$
$$1.47364312261585 \times \left(\frac{T1}{T2} - 1.44444444433333\right) +$$
$$0.147139222406418 \times (\theta1 - 90) +$$
$$0.027293067872581 \times (\theta2 - 90) +$$
$$(-0.00269948950340448) \times \{(\theta1 - 90) \times (\theta1 - 90) - 3000\} +$$
$$(-0.0000172509717474722) \times$$
$$\{(\theta1 - 90) \times (\theta1 - 90) \times (\theta1 - 90) - 0\} +$$
$$0.0000001945355412511 \times$$
$$\{(\theta1 - 90) \times (\theta1 - 90) \times (\theta1 - 90) \times (\theta1 - 90) - 16140000\} +$$
$$(-0.00051780690800265) \times \{(\theta2 - 90) \times (\theta2 - 90) - 3000\} +$$
$$0.0122489432338179 \times \left(\frac{T1}{T2} - 1.44444444433333\right) \times$$
$$(\theta1 - 90) + 0.000227381506027635 \times (\theta1 - 90) \times (\theta2 - 90)$$

$$4.15314165128706 + \qquad \text{Expression (8)}$$
$$2.21046180005218 \times \left(\frac{T1}{T2} - 1.44444444433333\right) +$$
$$0.0957589147129938 \times (\theta1 - 90) +$$
$$(-0.0148603685972844) \times (\theta2 - (-90)) +$$
$$(-0.00124406678097088) \times \{(\theta1 - 90) \times (\theta1 - 90) - 3000\} +$$
$$(-0.0000143982239697196) \times$$
$$\{(\theta1 - 90) \times (\theta1 - 90) \times (\theta1 - 90) - 0\} +$$
$$0.0000001129052061548 \times$$
$$\{(\theta1 - 90) \times (\theta1 - 90) \times (\theta1 - 90) \times (\theta1 - 90) - 16140000\} +$$
$$0.000232359950603504 \times$$
$$\{(\theta2 - (-90)) \times (\theta2 - (-90)) - 3000\} +$$
$$0.0218577462805003 \times$$
$$\left(\frac{T1}{T2} - 1.44444444433333\right) \times (\theta1 - 90) +$$
$$(-0.00023453790132842) \times (\theta1 - 90) \times (\theta2 - (-90))$$

With the acoustic wave device (1; 1*a*; 1*b*; 1*c*) according to the above-described preferred embodiment, a preferable TCF may be achieved.

In an acoustic wave device (1; 1*a*; 1*b*; 1*c*) according to a preferred embodiment of the present invention, the second Euler angle θ1 and the second Euler angle θ2 are values such that the absolute value of the TCF falls within a range of about 10 ppm/° C. or less.

With the acoustic wave device (1; 1*a*; 1*b*; 1*c*) according to the above-described preferred embodiment, a more favorable TCF may be achieved.

In an acoustic wave device (1; 1*a*; 1*b*; 1*c*) according to a preferred embodiment of the present invention, the lithium tantalate piezoelectric layer (first piezoelectric layer 3A) has a single crystal structure. The lithium niobate piezoelectric layer (second piezoelectric layer 3B) has a single crystal structure.

In an acoustic wave device (1; 1*a*; 1*b*; 1*c*) according to a preferred embodiment of the present invention, at least either one of the lithium tantalate piezoelectric layer (first piezoelectric layer 3A) and the lithium niobate piezoelectric layer (second piezoelectric layer 3B) is rotated Y-cut.

With the acoustic wave device (1; 1*a*; 1*b*; 1*c*) according to the above-described preferred embodiment, an SH wave may more efficiently be excited, and the usability is high.

In an acoustic wave device (1; 1*a*; 1*b*; 1*c*) according to a preferred embodiment of the present invention, both the lithium tantalate piezoelectric layer (first piezoelectric layer 3A) and the lithium niobate piezoelectric layer (second piezoelectric layer 3B) are rotated Y-cut.

With the acoustic wave device (1; 1*a*; 1*b*; 1*c*) according to the above-described preferred embodiment, an SH wave may further efficiently be excited.

An acoustic wave device (1; 1*a*; 1*c*) according to a preferred embodiment of the present invention further includes a low acoustic velocity film (4). In the low acoustic velocity film (4), an acoustic velocity of a bulk wave propagating through the low acoustic velocity film (4) is lower than an acoustic velocity of a bulk wave propagating through the lithium tantalate piezoelectric layer (first piezoelectric layer 3A) and the lithium niobate piezoelectric layer (second piezoelectric layer 3B). The low acoustic velocity film (4) is provided between the support substrate (2) and the multilayer body (3).

With the acoustic wave device (1; 1*a*; 1*c*) according to the above-described preferred embodiment, the Q factor of the acoustic wave device (1; 1*a*; 1*c*) may be improved.

An acoustic wave device (1; 1*c*) according to a preferred embodiment of the present invention further includes a high acoustic velocity film (5). As for the high acoustic velocity film (5), an acoustic velocity of a bulk wave propagating through the high acoustic velocity film (5) is higher than an acoustic velocity of an acoustic wave propagating through the lithium tantalate piezoelectric layer (first piezoelectric layer 3A) and the lithium niobate piezoelectric layer (second piezoelectric layer 3B). The high acoustic velocity film (5) is provided between the support substrate (2) and the low acoustic velocity film (4).

With the acoustic wave device (1; 1*c*) according to the above-described preferred embodiment, the Q factor of the acoustic wave device (1) may further be improved.

In an acoustic wave device (1*c*) according to a preferred embodiment of the present invention, the multilayer body (3) further includes a silicon oxide layer (3C). The silicon oxide layer (3C) is provided between the lithium tantalate piezoelectric layer (first piezoelectric layer 3A) and the lithium niobate piezoelectric layer (second piezoelectric layer 3B).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
   a support substrate;
   a multilayer body including a lithium tantalate piezoelectric layer and a lithium niobate piezoelectric layer that are laminated, and provided on the support substrate; and
   an interdigital transducer (IDT) electrode on the multilayer body and including a plurality of electrode fingers; wherein
   when a wavelength of an acoustic wave determined by a pitch of the plurality of electrode fingers is denoted as $\lambda$, a thickness of the multilayer body is about $0.66\lambda$ or less.

2. The acoustic wave device according to claim 1, wherein
   the lithium tantalate piezoelectric layer is laminated on a side of the IDT electrode; and
   the lithium niobate piezoelectric layer is laminated on a side of the support substrate.

3. The acoustic wave device according to claim 1, wherein
   the lithium tantalate piezoelectric layer is laminated on a side of the support substrate; and
   the lithium niobate piezoelectric layer is laminated on a side of the IDT electrode.

4. The acoustic wave device according to claim 2, wherein
   when a thickness of the lithium tantalate piezoelectric layer is denoted as T1, a thickness of the lithium niobate piezoelectric layer is denoted as T2, a second Euler angle of the lithium tantalate piezoelectric layer is denoted as $\theta 1$, and a second Euler angle of the lithium niobate piezoelectric layer is denoted as $\theta 2$;
   in a case that the second Euler angle $\theta 1$ is about $0°$ or more and about $180°$ or less, and the second Euler angle $\theta 2$ is about $0°$ or more and less than about $180°$, an electromechanical coupling coefficient satisfies Expression (1):

$$\begin{aligned}
&6.10489714829633 + \\
&(-1.33487064946561) \times \left(\frac{T1}{T2} - 1.44444444433333\right) + \\
&0.0751823042830098 \times (\theta 1 - 90) + \\
&0.083704332683124 \times (\theta 2 - 90) + \\
&0.927428408819691 \times \left\{\left(\frac{T1}{T2} - 1.44444444433333\right) \times \right.\\
&\left.\left(\frac{T1}{T2} - 1.44444444433333\right) - 1.28395061753088\right\} + \\
&(-0.00144447241419258) \times \{(\theta 1 - 90) \times (\theta 1 - 90) - 3000\} + \\
&(-0.0000077475616075308) \times \\
&\{(\theta 1 - 90) \times (\theta 1 - 90) \times (\theta 1 - 90) - 0\} + \\
&0.0000000903853423589 \times \\
&\{(\theta 1 - 90) \times (\theta 1 - 90) \times (\theta 1 - 90) \times (\theta 1 - 90) - 16140000\} + \\
&(-0.00143615455366066) \times \{(\theta 2 - 90) \times (\theta 2 - 90) - 3000\} + \\
&(-0.0000084727694286792) \times \\
&\{(\theta 2 - 90) \times (\theta 2 - 90) \times (\theta 2 - 90) - 0\} + \\
&0.0000000922825081781 \times \\
&\{(\theta 2 - 90) \times (\theta 2 - 90) \times (\theta 2 - 90) \times (\theta 2 - 90) - 16140000\} + \\
&(-0.0136937600766242) \times \left(\frac{T1}{T2} - 1.44444444433333\right) \times \\
&(\theta 2 - 90) + 0.00027245866480268 \times (\theta 1 - 90) \times (\theta 2 - 90);
\end{aligned}$$

in a case that the second Euler angle $\theta 1$ is about $0°$ or more and about $180°$ or less, and the second Euler angle $\theta 2$ is about $-180°$ or more and less than about $0°$, an electromechanical coupling coefficient satisfies Expression (2):

$$\begin{aligned}
&2.6203567327276 + (-0.891540666255983) \times \\
&\left(\frac{T1}{T2} - 1.44444444433333\right) + 0.0251129624812418 \times \\
&(\theta 1 - 90) + 0.026901842780151 \times (\theta 2 - (-90)) + \\
&1.29138198424116 \times \left\{\left(\frac{T1}{T2} - 1.44444444433333\right) \times \right.\\
&\left.\left(\frac{T1}{T2} - 1.44444444433333\right) - 1.28395061753088\right\} + \\
&0.000030767162653015 \times \{(\theta 1 - 90) \times (\theta 1 - 90) - 3000\} + \\
&(-0.0000053634747902267) \times \\
&\{(\theta 1 - 90) \times (\theta 1 - 90) \times (\theta 1 - 90) - 0\} + \\
&(-0.000397017013538763) \times \\
&\{(\theta 2 - (-90)) \times (\theta 2 - (-90)) - 3000\} + \\
&(-0.000006110078359279) \times \\
&\{(\theta 2 - (-90)) \times (\theta 2 - (-90)) \times (\theta 2 - (-90)) - 0\} + \\
&0.0000000559880444857 \times \{(\theta 2 - (-90)) \times (\theta 2 - (-90)) \times \\
&(\theta 2 - (-90)) \times (\theta 2 - (-90)) - 16140000\} + \\
&0.0110300006478456 \times \left(\frac{T1}{T2} - 1.44444444433333\right) \times \\
&(\theta 1 - 90) + \\
&(-0.00503930615559755) \times \\
&\left(\frac{T1}{T2} - 1.44444444433333\right) \times \\
&(\theta 2 - (-90)) + \\
&(-0.00025434331383419) \times \\
&(\theta 1 - 90) \times (\theta 2 - (-90));
\end{aligned}$$

and
   the second Euler angle $\theta 1$ and the second Euler angle $\theta 2$ are values such that the electromechanical coupling coefficient is about 4.0% or more.

5. The acoustic wave device according to claim 3, wherein
   when a thickness of the lithium niobate piezoelectric layer is denoted as T1, a thickness of the lithium tantalate piezoelectric layer is denoted as T2, a second Euler angle of the lithium niobate piezoelectric layer is denoted as $\theta 1$, and a second Euler angle of the lithium tantalate piezoelectric layer is denoted as $\theta 2$;
   in a case that the second Euler angle $\theta 1$ is about $0°$ or more and about $180°$ or less, and the second Euler angle $\theta 2$ is about $0°$ or more and less than about $180°$, an electromechanical coupling coefficient satisfies Expression (3):

$$7.62559513565327 +$$
$$1.4736431226185 \times \left(\frac{T1}{T2} - 1.44444444433333\right) +$$
$$0.147139222406418 \times (\theta1 - 90) +$$
$$0.027293067872581 \times (\theta2 - 90) +$$
$$(-0.00269948950340448) \times \{(\theta1 - 90) \times (\theta1 - 90) - 3000\} +$$
$$(-0.0000172509717474722) \times$$
$$\{(\theta1 - 90) \times (\theta1 - 90) \times (\theta1 - 90) - 0\} +$$
$$0.0000001945355412511 \times$$
$$\{(\theta1 - 90) \times (\theta1 - 90) \times (\theta1 - 90) \times (\theta1 - 90) - 16140000\} +$$
$$(-0.000517880690800265) \times$$
$$\{(\theta2 - 90) \times (\theta2 - 90) - 3000\} + 0.0122489432338179 \times$$
$$\left(\frac{T1}{T2} - 1.44444444433333\right) \times (\theta1 - 90) +$$
$$0.000227381506027635 \times (\theta1 - 90) \times (\theta2 - 90);$$

Expression (3)

in a case that the second Euler angle θ1 is about 0° or more and about 180° or less, and the second Euler angle θ2 is about −180° or more and less than about 0°, an electromechanical coupling coefficient satisfies Expression (4):

$$4.15314165128706 +$$
$$2.21046180005218 \times \left(\frac{T1}{T2} - 1.44444444433333\right)$$
$$0.0957589147129938 \times (\theta1 - 90) +$$
$$(-0.0148603685972844) \times (\theta2 - (-90)) +$$
$$(-0.00124406678097088) \times \{(\theta1 - 90) \times (\theta1 - 90) - 3000\} +$$
$$(-0.0000143982239697196) \times$$
$$\{(\theta1 - 90) \times (\theta1 - 90) \times (\theta1 - 90) - 0\} +$$
$$0.0000001129052061548 \times$$
$$\{(\theta1 - 90) \times (\theta1 - 90) \times (\theta1 - 90) \times (\theta1 - 90) - 16140000\} +$$
$$0.000232359950603504 \times$$
$$\{(\theta2 - (-90)) \times (\theta2 - (-90)) - 3000\} +$$
$$0.0218577462805003 \times$$
$$\left(\frac{T1}{T2} - 1.44444444433333\right) \times (\theta1 - 90) +$$
$$(-0.00023453790132842) \times (\theta1 - 90) \times (\theta2 - (-90));$$

Expression (4)

and
the second Euler angle θ1 and the second Euler angle θ2 are values such that the electromechanical coupling coefficient is about 4.0% or more.

6. The acoustic wave device according to claim 2, wherein when a thickness of the lithium tantalate piezoelectric layer is denoted as T1, a thickness of the lithium niobate piezoelectric layer is denoted as T2, a second Euler angle of the lithium tantalate piezoelectric layer is denoted as θ1, and a second Euler angle of the lithium niobate piezoelectric layer is denoted as θ2;

in a case that the second Euler angle θ1 is about 0° or more and about 180° or less, and the second Euler angle θ2 is about 0° or more and less than about 180°, a TCF satisfies Expression (5):

$$(-14.8326541312623) +$$
$$5.9468925587845 \times \left(\frac{T1}{T2} - 1.44444444433333\right) +$$
$$0.543285669216811 \times (\theta1 - 90) +$$
$$(-0.0289565650225207) \times (\theta2 - 90) +$$
$$(-2.78596009856013) \times \left\{\left(\frac{T1}{T2} - 1.44444444433333\right) \times \right.$$
$$\left.\left(\frac{T1}{T2} - 1.44444444433333\right) - 1.28395061753088\right\} +$$
$$(-0.00289637570199324) \times \{(\theta1 - 90) \times (\theta1 - 90) - 3000\} +$$
$$(-0.000117601847921907) \times$$
$$\{(\theta1 - 90) \times (\theta1 - 90) \times (\theta1 - 90) - 0\} +$$
$$0.0000002606431101102 \times$$
$$\{(\theta1 - 90) \times (\theta1 - 90) \times (\theta1 - 90) \times (\theta1 - 90) - 16140000\} +$$
$$0.0000000058278132228 \times \{(\theta1 - 90) \times$$
$$(\theta1 - 90) \times (\theta1 - 90) \times (\theta1 - 90) \times (\theta1 - 90) - 0\} +$$
$$0.000720583879743022 \times \{(\theta2 - 90) \times (\theta2 - 90) - 3000\} +$$
$$(-0.000456726259950784) \times (\theta1 - 90) \times (\theta2 - 90);$$

Expression (5)

in a case that the second Euler angle θ1 is about 0° or more and about 180° or less, and the second Euler angle θ2 is about −180° or more and less than about 0°, a TCF satisfies Expression (6):

$$2.6203567327276 +$$
$$(-0.891540666255983) \times \left(\frac{T1}{T2} - 1.44444444433333\right) +$$
$$0.0251129624812418 \times (\theta1 - 90) +$$
$$1.29138198424116 \times \left\{\left(\frac{T1}{T2} - 1.44444444433333\right) \times \right.$$
$$\left.\left(\frac{T1}{T2} - 1.44444444433333\right) - 1.28395061753088\right\} +$$
$$0.000030767162653015 \times \{(\theta1 - 90) \times (\theta1 - 90) - 3000\} +$$
$$(-0.0000053634747902267) \times$$
$$\{(\theta1 - 90) \times (\theta1 - 90) \times (\theta1 - 90) - 0\} +$$
$$0.0110300006478456 \times$$
$$\left(\frac{T1}{T2} - 1.44444444433333\right) \times (\theta1 - 90);$$

Expression (6)

and
the second Euler angle θ1 and the second Euler angle θ2 are values such that an absolute value of the TCF falls within a range of about 20 ppm/° C. or less.

7. The acoustic wave device according to claim 6, wherein the second Euler angle θ1 and the second Euler angle θ2 are values such that an absolute value of the TCF falls within a range of about 10 ppm/° C. or less.

8. The acoustic wave device according to claim 3, wherein when a thickness of the lithium niobate piezoelectric layer is denoted as T1, a thickness of the lithium tantalate piezoelectric layer is denoted as T2, a second Euler angle of the lithium niobate piezoelectric layer is denoted as θ1, and a second Euler angle of the lithium tantalate piezoelectric layer is denoted as θ2;

in a case that the second Euler angle θ1 is about 0° or more and about 180° or less, and the second Euler angle θ2 is about 0° or more and less than about 180°, a TCF satisfies Expression (7):

$$7.62559513565327 +$$
$$1.47364312261585 \times \left(\frac{T1}{T2} - 1.444444444433333\right) +$$
$$0.147139222406418 \times (\theta1 - 90) +$$
$$0.027293067872581 \times (\theta2 - 90) +$$
$$(-0.00269948950340448) \times \{(\theta1 - 90) \times (\theta1 - 90) - 3000\} +$$
$$(-0.0000172509717474722) \times$$
$$\{(\theta1 - 90) \times (\theta1 - 90) \times (\theta1 - 90) - 0\} +$$
$$0.0000001945355412511 \times$$
$$\{(\theta1 - 90) \times (\theta1 - 90) \times (\theta1 - 90) \times (\theta1 - 90) - 16140000\} +$$
$$(-0.00051780690800265) \times \{(\theta2 - 90) \times (\theta2 - 90) - 3000\} +$$
$$0.0122489432338179 \times \left(\frac{T1}{T2} - 1.444444444433333\right) \times$$
$$(\theta1 - 90) + 0.000227381506027635 \times (\theta1 - 90) \times (\theta2 - 90) ;$$

Expression (7)

in a case that the second Euler angle θ1 is about 0° or more and about 180° or less, and the second Euler angle θ2 is about −180° or more and less than about 0°, a TCF satisfies Expression (8):

$$4.15314165128706 +$$
$$2.21046180005218 \times \left(\frac{T1}{T2} - 1.444444444433333\right) +$$
$$0.0957589147129938 \times (\theta1 - 90) +$$
$$(-0.0148603685972844) \times (\theta2 - (-90)) +$$
$$(-0.00124406678097088) \times \{(\theta1 - 90) \times (\theta1 - 90) - 3000\} +$$
$$(-0.0000143982239697196) \times$$
$$\{(\theta1 - 90) \times (\theta1 - 90) \times (\theta1 - 90) - 0\} +$$
$$0.0000001129052061548 \times$$
$$\{(\theta1 - 90) \times (\theta1 - 90) \times (\theta1 - 90) \times (\theta1 - 90) - 16140000\} +$$
$$0.0002323599506603504 \times$$
$$\{(\theta2 - (-90)) \times (\theta2 - (-90)) - 3000\} +$$
$$0.0218577462805003 \times$$
$$\left(\frac{T1}{T2} - 1.444444444433333\right) \times (\theta1 - 90) +$$
$$(-0.00023453790132842) \times (\theta1 - 90) \times (\theta2 - (-90)) ;$$

Expression (8)

and
the second Euler angle θ1 and the second Euler angle θ2 are values such that an absolute value of the TCF falls within a range of about 20 ppm/° C. or less.

9. The acoustic wave device according to claim 8, wherein the second Euler angle θ1 and the second Euler angle θ2 are values such that an absolute value of the TCF falls within a range of about 10 ppm/° C. or less.

10. The acoustic wave device according to claim 1, wherein
the lithium tantalate piezoelectric layer has a single crystal structure; and
the lithium niobate piezoelectric layer has a single crystal structure.

11. The acoustic wave device according to claim 1, wherein at least one of the lithium tantalate piezoelectric layer and the lithium niobate piezoelectric layer is rotated Y-cut.

12. The acoustic wave device according to claim 11, wherein both of the lithium tantalate piezoelectric layer and the lithium niobate piezoelectric layer are rotated Y-cut.

13. The acoustic wave device according to claim 1, further comprising:
a low acoustic velocity film in which an acoustic velocity of a bulk wave propagating through the low acoustic velocity film is lower than an acoustic velocity of a bulk wave propagating through the lithium tantalate piezoelectric layer and the lithium niobate piezoelectric layer; wherein
the low acoustic velocity film is between the support substrate and the multilayer body.

14. The acoustic wave device according to claim 13, further comprising:
a high acoustic velocity film in which an acoustic velocity of a bulk wave propagating through the high acoustic velocity film is higher than an acoustic velocity of an acoustic wave propagating through the lithium tantalate piezoelectric layer and the lithium niobate piezoelectric layer; wherein
the high acoustic velocity film is between the support substrate and the low acoustic velocity film.

15. The acoustic wave device according to claim 1, wherein the multilayer body further includes a silicon oxide layer between the lithium tantalate piezoelectric layer and the lithium niobate piezoelectric layer.

16. The acoustic wave device according to claim 2, wherein
the lithium tantalate piezoelectric layer has a single crystal structure; and
the lithium niobate piezoelectric layer has a single crystal structure.

17. The acoustic wave device according to claim 2, wherein at least one of the lithium tantalate piezoelectric layer and the lithium niobate piezoelectric layer is rotated Y-cut.

18. The acoustic wave device according to claim 17, wherein both of the lithium tantalate piezoelectric layer and the lithium niobate piezoelectric layer are rotated Y-cut.

19. The acoustic wave device according to claim 2, further comprising:
a low acoustic velocity film in which an acoustic velocity of a bulk wave propagating through the low acoustic velocity film is lower than an acoustic velocity of a bulk wave propagating through the lithium tantalate piezoelectric layer and the lithium niobate piezoelectric layer; wherein
the low acoustic velocity film is between the support substrate and the multilayer body.

20. The acoustic wave device according to claim 19, further comprising:
a high acoustic velocity film in which an acoustic velocity of a bulk wave propagating through the high acoustic velocity film is higher than an acoustic velocity of an acoustic wave propagating through the lithium tantalate piezoelectric layer and the lithium niobate piezoelectric layer; wherein the high acoustic velocity film is between the support substrate and the low acoustic velocity film.

\* \* \* \* \*